(12) United States Patent
Dabbous et al.

(10) Patent No.: US 12,146,221 B2
(45) Date of Patent: Nov. 19, 2024

(54) ANTIMICROBIAL AND/OR ANTIVIRAL POLYMER SURFACES AND METHODS FOR THE PREPARATION THEREOF

(71) Applicant: MOLECULAR PLASMA GROUP S.A., Foetz (LU)

(72) Inventors: Raphael Dabbous, Riehen (CH); Rupert Konradi, Belmont, MA (US); Bert Verheyde, Hasselt (BE); Annick Vanhulsel, Betekom (BE); Olof Wallquist, Basel (CH)

(73) Assignee: MOLECULAR PLASMA GROUP S.A., Foetz (LU)

( * ) Notice: Subject to any disclaimer, the term of this patent is extended or adjusted under 35 U.S.C. 154(b) by 244 days.

(21) Appl. No.: 17/620,339

(22) PCT Filed: Jun. 18, 2020

(86) PCT No.: PCT/EP2020/066963
§ 371 (c)(1),
(2) Date: Dec. 17, 2021

(87) PCT Pub. No.: WO2020/254497
PCT Pub. Date: Dec. 24, 2020

(65) Prior Publication Data
US 2022/0316064 A1    Oct. 6, 2022

(30) Foreign Application Priority Data
Jun. 18, 2019    (EP) .................................... 19180910

(51) Int. Cl.
| | |
|---|---|
| *C23C 16/503* | (2006.01) |
| *A01N 33/12* | (2006.01) |
| *A01P 1/00* | (2006.01) |
| *B05D 1/00* | (2006.01) |
| *C08J 7/06* | (2006.01) |
| *C08J 7/12* | (2006.01) |
| *C23C 16/448* | (2006.01) |
| *C23C 16/453* | (2006.01) |
| *H01J 37/32* | (2006.01) |

(52) U.S. Cl.
CPC ............ *C23C 16/503* (2013.01); *A01N 33/12* (2013.01); *A01P 1/00* (2021.08); *B05D 1/62* (2013.01); *C08J 7/065* (2013.01); *C08J 7/123* (2013.01); *C23C 16/4486* (2013.01); *C23C 16/453* (2013.01); *H01J 37/32348* (2013.01); *H01J 37/32825* (2013.01); *C08J 2375/04* (2013.01); *H01J 2237/3321* (2013.01)

(58) Field of Classification Search
CPC .. C23C 16/503; C23C 16/4486; C23C 16/453
See application file for complete search history.

(56) References Cited

U.S. PATENT DOCUMENTS

| | | | | |
|---|---|---|---|---|
| 2006/0249705 | A1* | 11/2006 | Wang | .................. C04B 35/2683 |
| | | | | 501/141 |
| 2009/0104474 | A1* | 4/2009 | Schwartz | ................. A61L 27/18 |
| | | | | 428/704 |
| 2013/0084409 | A1 | 4/2013 | Vangeneugden et al. | |
| 2013/0112347 | A1* | 5/2013 | Dubreuil | ................... B05D 1/62 |
| | | | | 427/569 |
| 2017/0297055 | A1 | 10/2017 | Detrembleur et al. | |
| 2018/0243336 | A1* | 8/2018 | Vanepps | .................. C01G 9/02 |
| 2018/0289858 | A1* | 10/2018 | Bhaduri | .................. A61L 27/54 |

FOREIGN PATENT DOCUMENTS

| | | | | |
|---|---|---|---|---|
| DE | 102008029681 A1 | 12/2009 | | |
| EP | 3944763 A1 * | 2/2022 | ............ | A01N 25/34 |
| WO | 2008082293 A1 | 7/2008 | | |
| WO | 2012004175 A1 | 1/2012 | | |
| WO | WO 2017/011679 A1 * | 1/2017 | ............ | A61K 38/17 |
| WO | WO 2019/064216 A1 * | 4/2019 | ............ | A01N 59/16 |

OTHER PUBLICATIONS

Liu, Yiming, et al., "Antibacterial graphene oxide coatings on polymer substrate". Applied Surface Science, 436 (2018) 624-630.*
Rivero, Pedro Jose, et al., "An antibacterial coating based on a polymer/solgel hybrid matrix loaded with silver nanoparticles". Nanoscale Research Letters 2011, 6:305, pp. 1-7.*
Barillas, Laura, et al., "Bioactive and Antibacterial Plasma Sprayed Coatings on Polymer Substrates Suitable for Orthopedic and Tissue Engineering Applications". 2017 IEEE International Conference on Plasma Science (ICOPS), Atlantic City, NJ, USA, 2017, 1 page. Abstract Only.*
Vasilev, Krasimir, et al., "Antibacterial Surfaces and Coatings Producedby Plasma Techniques". Plasma Processes and Polymers, 2011, 8, 1010-1023.*
Bazaka, Olha, et al., "Effect of titanium surface topography on plasma deposition of antibacterial polymer coatings". Applied Surface Science, vol. 521, Aug. 15, 2020, 146375, pp. 1-16.*
Bosso et al., "Deposition of Water-Stable Coatings Containing Carboxylic Acid Groups by Atmospheric Pressure Cold Plasma Jet," Plasma Processes and Polymers, vol. 13, Jun. 5, 2015, pp. 217-226.
Davis et al., "Use of Atmospheric Pressure Plasma to Confer Durable Water Repellent Functionality and Antimicrobial Functionality on Cotton/Polyester Blend," Surface & Coatings Technology, vol. 205, No. 20, Apr. 21, 2011, pp. 4791-4797.

(Continued)

*Primary Examiner* — Bret P Chen
(74) *Attorney, Agent, or Firm* — Workman Nydegger

(57) ABSTRACT

A polymer substrate having deposited on its surface a reaction product of a precursor material obtained or obtainable by a method for preparation of polymer, and to the use of the polymer having improved antibacterial properties and/or antiviral properties or of the polymer having improved antibacterial properties and/or antiviral properties obtained or obtainable by the method for medical applications, antibiofouling applications, hygiene applications, food industry applications, industrial or computer related applications, consumer goods applications and appliances, public and public transport applications, underwater, water sanitation or seawater applications.

8 Claims, No Drawings

(56) References Cited

OTHER PUBLICATIONS

Fahmy et al., "Structure of Plasma-Deposited Copolymer Films Prepared from Acrylic Acid and Styrene: Part I Dependence on the Duty Cycle," Plasma Processes and Polymers, vol. 9, Dec. 28, 2011, pp. 273-284.
Kreider et al., "Functionalization of PDMS Modified and Plasma Activated Two-Component Polyurethane Coatings by Surface Attachment of Enzymes," Applied Surface Science, vol. 273, Feb. 26, 2013, pp. 562-569.
Widodo et al., "Surface Nanostructuring of Kevlar Fibers by Atmospheric Pressure Plasma-Induced Graft Polymerization for Multifunctional Protective Clothing," Journal of Polymer Science, vol. 50, May 21, 2012, pp. 1165-1172.
International Search Report and Written Opinion from PCT Application No. PCT/EP2020/066963, Sep. 14, 2020.

\* cited by examiner

ANTIMICROBIAL AND/OR ANTIVIRAL POLYMER SURFACES AND METHODS FOR THE PREPARATION THEREOF

BACKGROUND

The present invention relates to a method for preparation of a polymer material, such as a polyurethane, having improved antibacterial properties and/or antiviral properties comprising: a) providing a polymer substrate having a surface; b) generating a plasma under near atmospheric conditions by passing a carrier gas through an excitation zone and by applying high frequency alternating current to an electrode positioned in the excitation zone and a ground electrode to produce a discharge thereby generating an atmospheric plasma; c) generating a precursor material aerosol in a separate zone by using an atomiser gas or providing a gaseous precursor material, wherein the precursor material is a compound capable of forming radicals when in contact with an atmospheric plasma and which comprises at least one amine function; d) treating at least a part of the polymer substrate surface provided according to (a) with the atmospheric plasma generated according to (b) and the precursor material aerosol generated according to (c) or the gaseous precursor material provided according to (c) thereby depositing a reaction product of the precursor material at least on a part of the polymer substrate surface.

The present invention also relates to a polymer substrate having deposited on its surface a reaction product of a precursor material obtained or obtainable by this method and to the use of the polymer having improved antibacterial properties and/or antiviral properties or of the polymer having improved antibacterial properties and/or antiviral properties obtained or obtainable by the method for medical applications, antibiofouling applications, hygiene applications, food industry applications, industrial or computer related applications, consumer goods applications and appliances, public and public transport applications, underwater, water sanitation or seawater applications.

Polymer and plastic materials are used in huge amounts in different applications around the whole world. Often, people get in direct skin contact with the polymer material surface. In case of microbial contamination of the polymer surface, a risk of human infections and health problems exists. This holds true especially for polymer surfaces for household, kitchen, textile and personal care applications. In the food industry, the risk of contamination of food and short-life food products is high due to the growth and spread of microbes and bacteria on the polymer surfaces being used in this industry. In medical applications, the risk of infections and health problems is even higher due to a direct transfer of microbes and bacteria from contaminated polymer surfaces to body fluids and mucous membranes. In hospitals, the so-called Health Care Associated Infections (HCAI) are a known problem, but also in other areas such as food handling or food storage. The pathogenic micro-organisms that are of most widespread concern are: Methicillin Resistant *Staphylococcus aureus* (MRSA), *Clostridium difficile* and Norovirus. There is a growing need for materials with modified properties in order to get rid of or at least reduce the microbial and bacterial contamination.

One way for such modifications are coatings or other surface modifications also called topical treatments. Conventionally, the application of coatings or surface modification is often performed at reduced pressures using methods such as sputtering, vacuum deposition or ion plating. However, the realization of continuous production of such coatings or surface modification is difficult to realize at reduced pressure. Atmospheric plasma treatment processes have been proposed to overcome these problems in which a layer with the required physical and/or chemical property is formed on the surface of a substrate with a uniform composition or the surface itself of a substrate is modified. For example, WO 2012/004175 A1 discloses a continuous plasma treatment process and a plasma treatment apparatus. DE 10 2008 029 681A1 discloses a process for application of a self cleansing coating on a non-specified substrate, wherein a precursor material is introduced into the plasma beam as an aerosol, the precursor material being of metal organic or semi metal organic nature, such as an organic titanium or silica containing compound.

The functionalization of surfaces by atmospheric plasma treatment is known in the literature. Fibers, foams, membranes, polymers, micro and nano powders, glass and metal surfaces have been treated with "Chemistry Enhanced Plasma" (CEP, also known as PE-CVD, i.e. plasma enhanced chemical vapor deposition) in the last years. However, mostly very simple chemicals like acrylic acid (Piera Bosso, Fiorenza Fanelli, Francesco Fracassi, Plasma Process. Polym. 2016, 13, 217-226), combinations of acrylic acid and styrene (Alaa Fahmy, Renate Mix, Andreas Schönhals, Jörg Friedrich, Plasma Process. Polym. 2012, 9, 273-284) or with silanes (A. Kreider et al., Applied Surface Science 2013, 273, 562-569) have been used. Several publications also describe the use of plasma polymerizations with the purpose to generate surfaces which have antimicrobial properties. In WO 2008/082293 A1, a two-step technique is described where various surfaces are activated by a plasma treatment followed by the deposition of an antimicrobial active compound like quaternary ammonium compounds on the surface. Also, the antimicrobial active compound can firstly be provided on the surface and thereafter plasma polymerized generating an antimicrobial surface or an antimicrobial compound can be provided directly in the plasma chamber and thereafter being plasma polymerized. Davis Rachel, El-Shafei Ahmed and Hauser, Peter, Surface and Coatings Technology (2011), 205(20), 4791-4797 describe a process for preparing antimicrobial PES/cotton fabrics. Fluorinated monomers were firstly plasma polymerized on the fabrics. An antimicrobial quaternary ammonium monomer (DADMAC) was then padded onto the water-repellent fabric and subsequently polymerized through plasma exposure yielding an antimicrobial surface. Widodo Mohamad, El-Shafei Ahmed and Hauser, Peter J. From Journal of Polymer Science, Part B: Polymer Physics (2012), 50(16), 1165-1172 also describe a similar process by firstly impregnating Kevlar (poly-(p-phenylene terephthalamide or PPTA) with a quaternary ammonium monomer (DADMAC) and secondly plasma polymerizing the DADMAC on the Kevlar surface to achieve an antimicrobial surface.

However, a simple, fast, one-step process for producing a polymer material with antimicrobial properties and/or antiviral properties is not known.

DETAILED DESCRIPTION

The object of the present invention was therefore the provision of a polymer material having improved antibacterial properties and/or antiviral properties as well as the provision of a method for preparation of such a polymer material having improved antibacterial and/or antiviral properties.

According to the present invention, this object was solved by a method for preparation of polymer material having improved antibacterial properties comprising:

a) providing a polymer substrate having a surface;
b) generating a plasma under near atmospheric conditions by passing a carrier gas through an excitation zone and by applying high frequency alternating current to an electrode positioned in the excitation zone to produce a discharge thereby generating an atmospheric plasma;
c) generating a precursor material aerosol in a separate zone by using an atomiser gas or providing a gaseous precursor material, wherein the precursor material is a compound capable of forming radicals when in contact with an atmospheric plasma and which comprises at least one amine function;
d) treating at least a part of the polymer substrate surface provided according to (a) with the atmospheric plasma generated according to (b) and the precursor material aerosol generated according to (c) or the gaseous precursor material provided according to (c) thereby transporting the precursor material using the atomiser gas, and depositing and possibly reacting reaction products of the precursor material at least on a part of the polymer substrate surface.

A material's hydrophilic or hydrophobic properties can be classified based on the so called "contact angle". The "contact angle" is the angle, conventionally measured through the liquid, where a liquid interface meets a solid surface. The contact angle quantifies the wettability of a solid surface by a liquid, such as water, via the Young equation. Generally, if the water contact angle is smaller than 90°, the solid surface is considered hydrophilic and if the water contact angle is larger than 90°, the solid surface is considered hydrophobic. Highly hydrophobic surfaces have water contact angles as high as ~120°. Materials having a water contact angle even greater than 150 are called superhydrophobic surfaces.

The polymer material coated according to the method described above had an altered polarity, especially a hydrophilic surface, i.e. the previous hydrophobic material was turned hydrophilic by the method/the coating. The coating reduced the contact angle compared to the untreated reference by at least 22°. All polymer materials coated according to the method described above have a contact angle clearly below 90°.

Surprisingly, the coated polymer has clearly improved antibacterial properties towards both gram-negative and gram-positive bacteria as shown, for example, by a log reduction value (reduction of the number of bacteria) of at least a factor of 4.7 for gram-positive bacteria (*Staphylococcus aureus*) and by at least a factor of 5.2 for gram-negative bacteria (*Escherichia coli*) after 24 hours incubation (contact) time. The value of antibacterial activity (R) is defined as the logarithm of the average number of microorganisms on a sample without antimicrobial treatment after incubation for a chosen contact period (B) divided by the number of microorganisms on the antimicrobial surface after incubation for the same chosen contact period (C): R=Log (B/C).

In addition to the antibacterial properties found, the treated surfaces surprisingly also show antiviral activity. It can be assumed, that the innovative surfaces interact with the protein containing viral envelope of enveloped viruses like DNA and RNA viruses.

Thus, some embodiments of the present invention relate to a method for preparation of polymer material having improved antiviral properties comprising:

a) providing a polymer substrate having a surface;
b) generating a plasma under near atmospheric conditions by passing a carrier gas through an excitation zone and by applying high frequency alternating current to an electrode positioned in the excitation zone to produce a discharge thereby generating an atmospheric plasma;
c) generating a precursor material aerosol in a separate zone by using an atomiser gas or providing a gaseous precursor material, wherein the precursor material is a compound capable of forming radicals when in contact with an atmospheric plasma and which comprises at least one amine function;
d) treating at least a part of the polymer substrate surface provided according to (a) with the atmospheric plasma generated according to (b) and the precursor material aerosol generated according to (c) or the gaseous precursor material provided according to (c) thereby transporting the precursor material using the atomiser gas, and depositing and possibly reacting reaction products of the precursor material at least on a part of the polymer substrate surface.

Some preferred embodiments relate to a method for preparation of polymer material having improved antibacterial and/or antiviral properties, preferably antibacterial and antiviral properties, comprising:

a) providing a polymer substrate having a surface;
b) generating a plasma under near atmospheric conditions by passing a carrier gas through an excitation zone and by applying high frequency alternating current to an electrode positioned in the excitation zone to produce a discharge thereby generating an atmospheric plasma;
c) generating a precursor material aerosol in a separate zone by using an atomiser gas or providing a gaseous precursor material, wherein the precursor material is a compound capable of forming radicals when in contact with an atmospheric plasma and which comprises at least one amine function;
d) treating at least a part of the polymer substrate surface provided according to (a) with the atmospheric plasma generated according to (b) and the precursor material aerosol generated according to (c) or the gaseous precursor material provided according to (c) thereby transporting the precursor material using the atomiser gas, and depositing and possibly reacting reaction products of the precursor material at least on a part of the polymer substrate surface.

Surprisingly, it was also found, that the antimicrobial activity, especially the antibacterial activity, of the coated polymer surface was fast. Already after only 1 hour incubation (contact) time, log reductions values of up to 3.2 were observed. State of the art antimicrobials like silver shows no antimicrobial measurable activity at all after 1 hour contact time.

A "polymer material" especially a "polymer material having improved antibacterial and/or antiviral properties, preferably antibacterial and antiviral properties" means a polymer substrate having deposited at least on a part of its surface possibly reacting reaction products of the precursor material, which is synonymously also called coated polymer.

The "separate zone" of step c) is a zone different from the excitation zone of step b), preferably an atomiser zone. The precursor material aerosol of the first alternative of step c) is prepared outside of the excitation zone.

The term "carrier gas" means typically a gas suitable for generating and maintaining a dielectric barrier discharge (DBD) plasma. In particular, the carrier gas is selected from the group consisting of $N_2$, Ar, He, $CO_2$, $O_2$, $N_2O$, $CF_4$, $SF_6$ or a mixture of two or more of these gases.

The term "atomiser gas" typically means the gas used to nebulize or to create an aerosol in the atomiser as well as to transport the aerosol to and in the plasma. In particular, the atomizer gas is selected to be the same as the carrier gas.

A "Precursor material aerosol" means liquid or solid particles of the precursor material, preferably liquid particles of the precursor material, in an atomiser gas, wherein the aerosol optionally comprises solvent particles (if the precursor material has been used in liquid form as a solution in a solvent). The atomiser gas of aerosol is selected from the group consisting of $N_2$, Ar, He, a mixture of two or more of these gases, wherein the atomiser gas of the aerosol may be the same or different as or to the carrier gas of the plasma.

Regarding step b), high frequency alternating current is applied to one electrode. A second electrode is connected to the ground and in between the atmospheric plasma is generated.

Regarding step c) of the method described above: If a coating precursor is a gas, it may be introduced in the plasma as such or in a mixture with a carrier gas. If the coating precursor(s) comprise a liquid precursor or a solution of a precursor, that precursor may be introduced in the plasma as an aerosol together with an atomiser gas.

"Treating at least a part of the polymer substrate surface provided according to (a) with the atmospheric plasma generated according to (b) and the precursor material aerosol generated according to (c) or the gaseous precursor material provided according to (c)" according to (d) is to be understood in that at least a part of the polymer substrate surface provided according to (a) is treated with the atmospheric plasma generated according to (b) and the precursor material aerosol generated according to (c) or at least a part of the polymer substrate surface provided according to (a) is treated with the atmospheric plasma generated according to (b) and the gaseous precursor material provided according to (c).

According to one embodiment of the method for preparation of polymer material having improved antibacterial and/or antiviral properties, preferably antibacterial and antiviral properties, (d) comprises:
  d.1) treating the polymer substrate surface provided according to (a) with the atmospheric plasma generated according to (b);
  d.2a) introducing the precursor material aerosol generated according to (c) or the gaseous precursor material provided according to (c) into the atmospheric plasma used in (d.1), thereby forming an atmospheric plasma comprising the precursor material; or
  d.2b) treating the polymer substrate surface directly after step (d.1) in the "afterglow" with the precursor material aerosol generated according to (c) or with the gaseous precursor material provided according to (c).

Step (d.2a) can also be called an injection step, i.e. one can say that the precursor material aerosol generated according to (c) or the gaseous precursor material provided according to (c) is injected into the atmospheric plasma used in (d.1).

The term "precursor material aerosol" comprises an aerosol of one precursor material and mixtures/combinations of two or more precursor materials aerosols.

"Directly after step (d.1) in the "afterglow"" means with ≤10 minutes, preferably ≤1 minute, more preferably ≤30 seconds, more preferably ≤10 seconds after the treatment of the polymer substrate surface with the atmospheric plasma has been stopped.

According to one embodiment of the method for preparation of polymer material having improved antibacterial and/or antiviral properties, preferably antibacterial and antiviral properties, all steps (a) to (d) take place at near atmospheric pressure (near atmospheric conditions), preferably at a pressure in the range of from 0.5 to 1.5 bar, more preferably in the range of from 0.8 to 1.2 bar, more preferably in the range of from 0.9 to 1.1 bar.

Suitable plasmas for use in the method of the invention include non-equilibrium plasmas such as those generated by alternating current (ac) discharge, radiofrequency (rf), microwave or direct current (dc) discharge. The plasma is preferentially generated by alternating current (AC) discharge, applying alternating voltages up to 100 kV. A preferred high-frequency alternating voltage is in the range of 10 to 40 kV, wherein an optional small superimposed direct voltage component to stabilize the discharge, may also be applied.

The frequencies for generating the plasma are in the range of 1-100 kHz.

According to one embodiment of the method for preparation of polymer material having improved antibacterial and/or antiviral properties, preferably antibacterial and antiviral properties, two type of plasma configurations can be employed: direct plasma treatment (as in the PlasmaZone®) or indirect plasma treatment (as in the PlasmaSpot® (often called plasma jet) or PlasmaLine®) (both blow out the plasma from the zone between the electrodes where it is generated).

The specific power input values are different for direct and indirect plasma configurations. "Specific power input" means the amount of power divided by the surface of the electrode. For direct plasma it is typically between 0.2-0.8 $W/cm^2$. For direct plasma it is typically between 1-15 $W/cm^2$.

According to one embodiment of the method for preparation of polymer material having improved antibacterial and/or antiviral properties, preferably antibacterial and antiviral properties, prior to step (a) the polymer substrate having a surface is pre-treated by a method selected from the group consisting of flame treatment, corona treatment, VUV (vacuum-ultra-violet) irradiation, plasma pre-treatment and mixtures of two or more of these pre-treatment methods, wherein the plasma pre-treatment is done without a precursor material. In order to activate the substrate surface, it can sometimes be necessary to pre-treat the surface with a plasma without the presence of a precursor material or to pre-treat the surface by another activation method like flame treatments, corona treatments, VUV (vacuum-ultra-violet) irradiation; other methods can be used as well. Thus, one embodiment relates to a method for preparation of a polymer material having improved antibacterial properties, wherein prior to step (a) the polymer substrate having a surface is pre-treated by a method selected from the group consisting of flame treatment, corona treatment, VUV (vacuum-ultra-violet) irradiation, plasma pre-treatment (without precursor) and mixtures of two or more of these pre-treatment methods. In one embodiment the method for preparation of polymer material having improved antibacterial properties comprises prior to step (a):
  0.1) providing a polymer substrate having a surface;
  0.2) generating a plasma under near atmospheric conditions by passing a carrier gas through an excitation zone and by applying high frequency alternating current to an electrode positioned in the excitation zone to produce a dielectrical barrier discharge thereby generating an atmospheric plasma;

0.3) treating at least a part of the polymer substrate surface provided according to (0.1) with the atmospheric plasma generated according to (0.2) thereby activating the polymer substrate surface (plasma pre-treatment) and resulting in a polymer having an activated surface.

In case a pre-treatment is done, irrespective of the pre-treatment method applied, step (a) then comprises the provision of a polymer substrate having an activated surface.

The precursor material is an organic material. Herein, the term "precursor material" is used synonymous for "organic precursor material". According to one embodiment of the method for preparation of polymer material having improved antibacterial and/or antiviral properties, preferably antibacterial and antiviral properties, the precursor material is a compound capable of forming radicals when in contact with an atmospheric plasma and which contains at least one amine function selected from the group of primary, secondary, tertiary amines and quarternary ammonium salts, preferably from the group consisting of primary, secondary amines and quarternary ammonium salts, more preferably from the group consisting of primary and secondary amines. An alternatively preferred group consists of secondary ammines and quaternary ammonium salts. A very preferred embodiment relates to the amine function being a quaternary ammonium salt. The precursor material is used as single compound or as mixture of two or more compounds.

According to one embodiment of the method for preparation of polymer material having improved antibacterial and/or antiviral properties, preferably antibacterial and antiviral properties, the precursor material is a compound of general formula (I)

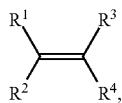

(I)

wherein
R$^1$ and R$^2$ are independently selected from the group consisting of hydrogen atom, halogen atom, CN, CF$_3$, straight or branched alkyl of from 1 to 20 carbon atoms, preferably from 1 to 6 carbon atoms, more preferably from 1 to 4 carbon atoms, a (CH$_2$)$_x$—(CF$_2$)$_y$—CF$_3$ group with x being zero or an integer in the range from 1 to 6 and y being an integer in the range from 1 to 20, preferably a (CH$_2$)$_x$—(CF$_2$)$_y$—CF$_3$ group with x being zero or an integer in the range from 1 to 4 and y being an integer in the range from 3 to 18; or an alpha, beta-unsaturated straight or branched alkenyl or alkynyl of 2 to 10 carbon atoms, preferably from 2 to 6 carbon atoms, more preferably from 2 to 4 carbon atoms, C5-C6 cycloalkyl, heterocycloalkyl, C(=Y)XR$^5$, where Y may be S or O, preferably O, and X is O or a bond,
R$^5$ is a straight or branched C1-C20 alkyl, a straight or branched C1-C20 alkoxy, a (CH$_2$)$_x$—(CF$_2$)$_y$—CF$_3$ group with x being an integer in the range from 0 to 6 and y being an integer in the range from 1 to 20, preferably R$^5$ is a (CH$_2$)$_x$—(CF$_2$)$_y$—CF$_3$ group with x being zero or an integer in the range from 1 to 4 and y being an integer in the range from 3 to 18;
R$^3$ is selected from the group consisting of hydrogen atom, halogen atom, preferably fluorine or chlorine, C1-C6, preferably C1, alkyl and COOR$^6$, where R$^6$ is a C1-C6 alkyl group;

or
R$^1$ and R$^3$ may be joined to form a group of the formula (CH$_2$)$_m$, optionally substituted with one or more C1-C4 alkyl group(s), wherein m is an integer in the range of from 2 to 6, preferably 3 or 4;
and
R$^4$ is a primary or secondary amine group of the general formula (II)

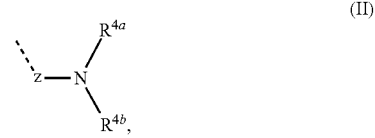

(II)

wherein
z is selected from the group consisting of —(CH$_2$)$_p$—, wherein p is an integer in the range of from 1 to 10, preferably 1; —(C(=O)—O—(CH$_2$)$_q$—, wherein q is an integer in the range of from 1 to 10, preferably in the range of from 2 to 4, more preferably 2; and —(C$_6$H$_4$)—(CH$_2$)$_r$, wherein r is an integer in the range of from 1 to 10, preferably 1;
R$^{4a}$ is a hydrogen atom, an aryl group or a branched or unbranched C1 to C10 alkyl group;
R$^{4b}$ is a hydrogen or is selected from the group consisting of a branched or unbranched C1 to C18-alkyl group; a C1 to C6-alkyl-phenyl-R$^7$ group, wherein R$^7$ is a saturated or unsaturated, branched or unbranched C1 to C6-alkyl group;
wherein R$^{4a}$ and R$^{4b}$ preferably are both hydrogen atoms, or wherein R$^{4a}$ is preferably a hydrogen atom and R$^{4b}$ is a C2-C5 straight or branched alkyl, more preferable isopropyl or t-butyl, and more preferable tert-butyl.

According to one embodiment,
R$^1$ and R$^2$ are independently selected from the group consisting of hydrogen atom, halogen atom, CN, CF$_3$, straight or branched alkyl of from 1 to 20 carbon atoms, preferably from 1 to 6 carbon atoms, more preferably from 1 to 4 carbon atoms, a (CH$_2$)$_x$—(CF$_2$)$_y$—CF$_3$ group with x being zero or an integer in the range from 1 to 6 and y being an integer in the range from 1 to 20, preferably a (CH$_2$)$_x$—(CF$_2$)$_y$—CF$_3$ group with x being zero or an integer in the range from 1 to 4 and y being an integer in the range from 3 to 18; or an alpha, beta-unsaturated straight or branched alkenyl or alkynyl of 2 to 10 carbon atoms, preferably from 2 to 6 carbon atoms, more preferably from 2 to 4 carbon atoms, C5-C6 cycloalkyl, heterocycloalkyl, C(=Y)XR$^5$, where Y may be S or O, preferably O, and X is O or a bond,
R$^5$ is a straight or branched C1-C20 alkyl, a straight or branched C1-C20 alkoxy, a (CH$_2$)$_x$—(CF$_2$)$_y$—CF$_3$ group with x being an integer in the range from 0 to 6 and y being an integer in the range from 1 to 20, preferably R$^5$ is a (CH$_2$)$_x$—(CF$_2$)$_y$—CF$_3$ group with x being zero or an integer in the range from 1 to 4 and y being an integer in the range from 3 to 18;
R$^3$ is selected from the group consisting of hydrogen atom, halogen atom, preferably fluorine or chlorine, C1-C6, preferably C1, alkyl and COOR$^6$, where R$^6$ is a C1-C6 alkyl group;
or
R$^1$ and R$^3$ may be joined to form a group of the formula (CH$_2$)$_m$, optionally substituted with one or more C1-C4 alkyl group(s), wherein m is an integer in the range of from 2 to 6, preferably 3 or 4; and $R^4$ is a primary or secondary amine group of the general formula (II)

wherein
z is selected from the group consisting of —$(CH_2)_p$—, wherein p is an integer in the range of from 1 to 10, preferably 1; —C(=O)—O—$(CH_2)_q$—, wherein q is an integer in the range of from 1 to 10, preferably in the range of from 2 to 4, more preferably 2; and —$(C_6H_4)$—$(CH_2)_r$—, wherein r is an integer in the range of from 1 to 10, preferably 1;

$R^{4a}$ is a hydrogen atom, an aryl group or a branched or unbranched C1 to C10 alkyl group;

$R^{4b}$ is a hydrogen or is selected from the group consisting of a branched or unbranched C1 to C18-alkyl group; a C1 to C6-alkyl-phenyl-$R^7$ group, wherein $R^7$ is a saturated or unsaturated, branched or unbranched C1 to C6-alkyl group;

wherein $R^{4a}$ and $R^{4b}$ preferably are both hydrogen atoms, or wherein $R^{4a}$ is preferably a hydrogen atom and $R^{4b}$ is a C2-C5 straight or branched alkyl, more preferable isopropyl or t-butyl, and more preferable tert-butyl.

According to one embodiment of the method for preparation of polymer material having improved antibacterial properties, the compound of general formula (I) is selected from the group consisting of allyl amine, t-butylaminoethyl methacrylate (TBAEMA), t-butylaminomethyl methacrylate, t-butylaminopropyl methacrylate, t-butylaminoethyl acrylate, t-butylaminomethyl acrylate, t-butylaminopropyl acrylate, t-butylaminoethyl acrylamide, t-butylaminomethyl acrylamide, t-butylaminopropyl acrylamide, t-butylaminoethyl methacrylamide, t-butylaminomethyl methacrylamid, t-butylaminopropyl methacrylamide, tert-butyl aminomethyl styrene (TBAMS) and poly TBAMS; more preferably from the group consisting of allyl amine, TBAEMA, TBAMS, and poly TBAMS, more preferably allyl amine and TBAEMA, or from the group consisting of tridecafluorooctyl acrylate (TFOA), methacrylic ester of methylpolyethyleneglycol (MPEG 350 MA) and 2-hydroxyethylmethacrylate (HEMA), more preferably TFOA.

PolyTBAMS has a molecular weight Mw in the range of from of 50,000 g/mol to 100,000 g/mol, preferably in the range of from 1,000 to 90,000 g/mol, more preferred in the range of from 5,000 to 80,000 g/mol.

According to another embodiment of the method for preparation of polymer material having improved antibacterial and/or antiviral properties, preferably antibacterial and antiviral properties, the precursor material is a solution of the compound of general formula (III) in a solvent

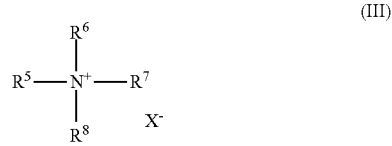

wherein $R^5$, $R^6$, $R^7$ and $R^8$ are independently selected from a group consisting of straight or branched alkyl of from 1 to 20 carbon atoms, preferably from 1 to 18 carbon atoms, preferably $R^8$ is hexyl and $R^5$, $R^6$, $R^7$ are methyl or ethyl; unsubstituted or substituted phenyl, preferably phenyl; benzyl; or wherein $R^5$ and $R^6$ are joined together with $N^+$ to form a six membered ring and $R^7$, $R^8$ are straight or branched alkyl of from 1 to 20 carbon atoms or a bond;

wherein $X^-$ is selected from the group consisting of a halide, preferably chloride or bromide; sulfonate; sulfate; acetate and carboxylate, preferably acetate.

and wherein the solvent is an alcohol, another polar solvent or water, wherein the compound of general formula (III) is preferably selected from the group consisting of hexadecyltrimethylammonium chloride (CTAB), benzalkonium chloride (BAC), hexadecylpyridinium chloride (HDPC), octadecyl dimethyl (3-triethoxysilylpropyl) ammonium chloride and mixtures of two or more of these compounds;

wherein the alcohol or other polar solvent has a $\log_{KOW}$ in the range from −3 to +1 and wherein the solvent can preferably dissolve the quaternary ammonium salt at concentrations above 10 wt % The alcohol is preferably selected from the group of branched or unbranched C1 to C10 alkanols, preferably from the group of branched or unbranched C1 to C5 mono- or diols The compound of general formula (III) has a concentration in the solution of ≥10 weight-%, preferably ≥20 weight-%, more preferred ≥30 weight-%, more preferred ≥40 weight-%. The compound of general formula (III) has a concentration in the solution of ≤80 weight-%, preferably ≤70 weight-%, more preferred ≤60 weight-%, more preferred ≤50 weight-%. Preferably, compound of general formula (III) has a concentration in the solution in the range of from 10 to 80 weight-%, more preferred in the range of from 20 to 70 weight-%, more preferred in the range of from 30 to 60 weight-%, more preferred in the range of from 40 to 50 weight-%, in relation to the overall weight of the solution.

According to one embodiment of the method for preparation of polymer material having improved antibacterial properties, the polymer substrate is cellulose or a homopolymer or copolymer selected from the group consisting of a thermoset, a thermoplastic, an elastomer and a thermoplastic elastomer, preferably a thermoplastic or a thermoplastic elastomer selected from the group consisting of thermoplastic polyurethane (TPU), poly(ether sulfone) (PESU), polyethylene (PE), polypropylene (PP), cellulose triacetate (TAC), polyamide (PA), polyester (PES), polylactic acid (PLA), polybutylene adipate terephthalate (PBAT), polyolefins (PO), polyvinyl chloride (PVC), polystyrene (PS), polycarbonate (PC), polyketone, poly(methyl methacrylate) (PMMA), polyoxymethylene (POM), polyphenylene oxide (PPE), polyacrylate, poly acrylamide, silicone, and any blend of two or more thereof; preferably from the group consisting of TPU, PA, PES, PO, PS, PC, TAC, silicone, and any blend of two or more thereof; more preferably from the group consisting of TPU, PA, silicone, and any blend of two or more thereof; more preferably TPU and/or silicone.

TPU

According to one embodiment of the method for preparation of polymer material having improved antibacterial properties, the polymer is a thermoplastic polyurethane (TPU). TPU is obtained or obtainable by reaction of (i) at least one poly isocyanate composition, (ii) at least one chain extender composition and (iii) at least one polyol composition.

According to one embodiment of the method for preparation of polymer material having improved antibacterial properties, the poly isocyanate composition (i) comprises at least one poly isocyanate selected from the group consisting of diphenylene methane diisocyanate (MDI), toluene diisocyanate (TDI), hexamethylene diisocyanate (HDI), and dicyclohexylene methane-4,4'-diisocyanate (H12MDI), and comprises preferably at least MDI, H12MDI or HDI.

According to one embodiment of the method for preparation of polymer material having improved antibacterial properties, the chain extender composition (ii) comprises at least a diol (D1), wherein the diol D1 is selected from the group consisting of ethane diol, butane diol, and hexane diol; and is preferably 1,4-butane diol.

According to one embodiment of the method for preparation of polymer material having improved antibacterial properties, the polyol composition (iii) comprises at least one diol (C1), which is preferably a polyether-based or a polyester-based diol, for instance poly tetrahydrofurane (pTHF), wherein the pTHF has preferably a number average molecular weight $M_n$ in the range of from 500 to 3000 g/mol, preferably in the range of from 1000 to 2000 g/mol.

According to one embodiment of the method for preparation of polymer material having improved antibacterial properties, the thermoplastic polyurethane is obtained or obtainable by reaction of (i) a poly isocyanate composition, (ii) a chain extender composition and (iii) a polyol composition, wherein the poly isocyanate composition (i) comprises at least MDI or HDI;
the chain extender composition (ii) comprises at least 1,4-butane diol; and the polyol composition (iii) comprises at least pTHF.
Silicone According to one embodiment of the method for preparation of polymer material having improved antibacterial properties, the polymer can be a silicone. The silicone is obtained or obtainable in three steps by synthesis of chlorosilanes followed by hydrolysis of the chlorosilanes followed by a condensation polymerisation.

According to one embodiment of the method for preparation of polymer material having improved antibacterial properties, the polymer substrate is a thermoplastic polyurethane or a silicone part, for example film, foil, belt, plate, fiber, foam, membrane, pellets, powder, tubing, or pipe, preferably a thermoplastic polyurethane film, foil, belt, membrane or tubing.

The invention also relates to a polymer substrate having deposited on its surface a reaction product of a precursor material obtained or obtainable by the method as described above.

The Polymer Having Improved Antibacterial Properties

The invention also relates to a polymer having improved antibacterial properties obtained or obtainable by a method comprising:
a) providing a polymer substrate having a surface;
b) generating a plasma under atmospheric conditions by passing a carrier gas through an excitation zone and by applying high frequency alternating current to an electrode positioned in the excitation zone to produce a dielectrical barrier discharge thereby generating an atmospheric plasma;
c) generating a precursor material aerosol in a separate zone or providing a gaseous precursor material, wherein the precursor material is a compound capable of forming radicals when in contact with an atmospheric plasma;
d) treating at least a part of the polymer substrate surface provided according to (a) with the atmospheric plasma generated according to (b) and the precursor material aerosol generated according to (c) or the gaseous precursor material provided according to (c) thereby depositing a reaction product of the precursor material at least on a part of the polymer substrate surface.

According to one embodiment of the polymer having improved antibacterial properties, (d) comprises:
d.1) treating the polymer substrate surface provided according to (a) with the atmospheric plasma generated according to (b);
d.2a) introducing the precursor material aerosol generated according to (c) or the gaseous precursor material provided according to (c) into the atmospheric plasma used in (d.1), thereby forming an atmospheric plasma comprising the precursor material; or
d.2b) treating the polymer substrate surface directly after step (d.1) with the precursor material aerosol generated according to (c) or the gaseous precursor material provided according to (c).

According to one embodiment of the polymer having improved antibacterial properties, all steps (a) to (d) take place at near atmospheric pressure, preferably at a pressure in the range of from 0.5 to 1.5 bar, more preferably in the range of from 0.8 to 1.2 bar, more preferably in the range of from 0.9 to 1.1 bar.

According to one embodiment of the polymer having improved antibacterial properties, the precursor material is a compound capable of forming radicals when in contact with an atmospheric plasma and which contains at least one amine function selected from the group of primary, secondary, tertiary amines and quarternary ammonium salts, preferably from the group consisting of primary, secondary amines and quarternary ammonium salts, more preferably from the group consisting of primary and secondary amines. In an alternatively preferred embodiment, the precursor material is a compound capable of forming radicals when in contact with an atmospheric plasma and which contains at least one amine function selected from the group consisting of secondary amines and quaternary ammonium salts, and the amine function is more preferred a quarternary ammonium salt.

According to one embodiment of the polymer having improved antibacterial properties, the precursor material is a compound of general formula (I)

wherein
$R^1$ and $R^2$ are independently selected from the group consisting of hydrogen atom, halogen atom, CN, $CF_3$, straight or branched alkyl of from 1 to 20 carbon atoms, preferably from 1 to 6 carbon atoms, more preferably from 1 to 4 carbon atoms, a $(CH_2)_x$—$(CF_2)_y$—$CF_3$ group with x being zero or an integer in the range from 1 to 6 and y being an integer in the range from 1 to 20, preferably a $(CH_2)r(CF_2)_y$—$CF_3$ group with x being zero or an integer in the range from 1 to 4 and y being an integer in the range from 3 to 18; or a —(C1 to C10-alkylene-O—)$_n$—C1 to C5 alkyl or a —(C1 to C10-alkylene-O—)$_n$—H group with n being an integer in the range of 1 to 80, preferably a —(C1 to C10-alkylene-O)$_n$—C1 to C5 alkyl group or a —((C1 to C10-alkylene-O—)$_n$—H group with n being an integer in the range of 1 to 25, more preferably a —(CH$_2$—CH$_2$—O—)$_n$—CH$_3$-group or a —(CH$_2$—CH$_2$—O—)$_n$—H group with n being an integer in the range of 1 to 12, alpha, beta-unsaturated straight or branched alkenyl or alkynyl of 2 to 10 carbon atoms, preferably from 2 to 6 carbon atoms, more preferably from 2 to 4 carbon atoms, C5-C6 cycloalkyl, heterocycloalkyl, C(=Y)XR$^5$, where Y may be S or O, preferably O, and X is O or a bond, R$^5$ is a straight or branched C1-C20 alkyl, a straight or branched C1-C20 alkoxy, a (CH$_2$)$_x$—(CF$_2$)$_y$—CF$_3$ group with x being an integer in the range from 0 to 6 and y being an integer in the range from 1 to 20, preferably R$^5$ is a (CH$_2$)$_x$—(CF$_2$)$_y$—CF$_3$ group with x being zero or an integer in the range from 1 to 4 and y being an integer in the range from 3 to 18; or a —(C1 to C10-alkylene-O—)$_n$—C1 to C5 alkyl or a —(C1 to C10-alkylene-O—)n-H group with n being an integer in the range of 1 to 80, preferably a —(C1 to C10-alkylene-O)$_n$—C1 to C5 alkyl group or a —((C1 to C10-alkylene-O—)$_n$—H group with n being an integer in the range of 1 to 25, more preferably a —(CH$_2$—CH$_2$—O—)$_n$—CH$_3$-group or a —(CH$_2$—CH$_2$—O—)$_n$—H group with n being an integer in the range of 1 to 12;

R$^3$ is selected from the group consisting of hydrogen atom, halogen atom, preferably fluorine or chlorine, C1-C6, preferably C1, alkyl and COOR$^6$, where R$^6$ is a hydrogen atom or a C1-C6 alkyl group; or R$^1$ and R$^3$ may be joined to form a group of the formula (CH$_2$)$_m$, optionally substituted with one or more C1-C4 alkyl group(s), wherein m is an integer in the range of from 2 to 6, preferably 3 or 4;

R$^4$ is a primary or secondary amine group of the general formula (II)

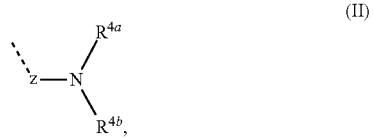

(II)

wherein z is selected from the group consisting of —(CH$_2$)$_p$—, wherein p is an integer in the range of from 1 to 10, preferably 1; —(C(=O)—O—(CH$_2$)$_q$—, wherein q is an integer in the range of from 1 to 10, preferably in the range of from 2 to 4, more preferably 2; and —(C$_6$H$_4$)—(CH$_2$)$_r$, wherein r is an integer in the range of from 1 to 10, preferably 1;

R$^{4a}$ is a hydrogen atom, an aryl group or a branched or unbranched C1 to C10 alkyl group;

R$^{4b}$ is a hydrogen atom or is selected from the group consisting of a branched or unbranched C1 to C18-alkyl group; a C1 to C6-alkyl-phenyl-R$^7$ group, wherein R$^7$ is a saturated or unsaturated, branched or unbranched C1 to C6-alkyl group;

wherein R$^{4a}$ and R$^{4b}$ preferably are both hydrogen atoms, or wherein R$^{4a}$ is preferably a hydrogen atom and R$^{4b}$ is a C2-C5 straight or branched alkyl, more preferable isopropyl or t-butyl, and more preferable tert-butyl.

According to some embodiments,

R$^1$ and R$^2$ are independently selected from the group consisting of hydrogen atom, halogen atom, CN, CF$_3$, straight or branched alkyl of from 1 to 20 carbon atoms, preferably from 1 to 6 carbon atoms, more preferably from 1 to 4 carbon atoms, a (CH$_2$)$_x$—(CF$_2$)$_y$—CF$_3$ group with x being zero or an integer in the range from 1 to 6 and y being an integer in the range from 1 to 20, preferably a (CH$_2$)$_x$—(CF$_2$)$_y$—CF$_3$ group with x being zero or an integer in the range from 1 to 4 and y being an integer in the range from 3 to 18; or an alpha, beta-unsaturated straight or branched alkenyl or alkynyl of 2 to 10 carbon atoms, preferably from 2 to 6 carbon atoms, more preferably from 2 to 4 carbon atoms, C5-C6 cycloalkyl, heterocycloalkyl, C(=Y)XR$^5$, where Y may be S or O, preferably O, and X is O or a bond, R$^5$ is a straight or branched C1-C20 alkyl, a straight or branched C1-C20 alkoxy, a (CH$_2$)$_x$—(CF$_2$)$_y$—CF$_3$ group with x being an integer in the range from 0 to 6 and y being an integer in the range from 1 to 20, preferably R$^5$ is a (CH$_2$)$_x$—(CF$_2$)$_y$—CF$_3$ group with x being zero or an integer in the range from 1 to 4 and y being an integer in the range from 3 to 18;

R$^3$ is selected from the group consisting of hydrogen atom, halogen atom, preferably fluorine or chlorine, C1-C6, preferably C1, alkyl and COOR6, where R$^6$ is a C1-C6 alkyl group;

or

R$^1$ and R$^3$ may be joined to form a group of the formula (CH$_2$)$_m$, optionally substituted with one or more C1-C4 alkyl group(s), wherein m is an integer in the range of from 2 to 6, preferably 3 or 4;

R$^4$ is a primary or secondary amine group of the general formula (II)

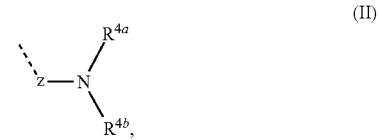

(II)

wherein z is selected from the group consisting of —(CH$_2$)$_p$—, wherein p is an integer in the range of from 1 to 10, preferably 1; —(C(=O)—O—(CH$_2$)$_q$—, wherein q is an integer in the range of from 1 to 10, preferably in the range of from 2 to 4, more preferably 2; and —(C$_6$H$_4$)—(CH$_2$)$_r$, wherein r is an integer in the range of from 1 to 10, preferably 1;

R$^{4a}$ is a hydrogen atom, an aryl group or a branched or unbranched C1 to C10 alkyl group;

R$^{4b}$ is a hydrogen atom or is selected from the group consisting of a branched or unbranched C1 to C18-alkyl group; a C1 to C6-alkyl-phenyl-R$^7$ group, wherein R$^7$ is a saturated or unsaturated, branched or unbranched C1 to C6-alkyl group;

wherein R$^{4a}$ and R$^{4b}$ preferably are both hydrogen atoms, or wherein R$^{4a}$ is preferably a hydrogen atom and R$^{4b}$ is a C2-C5 straight or branched alkyl, more preferable isopropyl or t-butyl, and more preferable tert-butyl.

According to one embodiment of the polymer having improved antibacterial properties, the compound of general formula (I) is selected from the group consisting of allyl amine, t-butylaminoethyl methacrylate (TBAEMA), t-butylaminomethyl methacrylate, t-butylaminopropyl methacrylate, t-butylaminoethyl acrylate, t-butylaminomethyl acrylate, t-butylaminopropyl acrylate, t-butylaminoethyl acrylamide, t-butylaminomethyl acrylamide, t-butylaminopropyl acrylamide, t-butylaminoethyl methacrylamide, t-butylaminomethyl methacrylamid, t-butylaminopropyl methacrylamide, tert-butyl aminomethyl styrene (TBAMS) and poly TBAMS; more preferably from the group consisting of allyl amine, TBAEMA, TBAMS, and poly TBAMS, more preferably allyl amine and TBAEMA, or from the group consisting of tridecafluorooctyl acrylate (TFOA), methacrylic ester of methylpolyethyleneglycol (MPEG 350 MA) and 2-hydroxyethylmethacrylate (HEMA), more preferably TFOA.

PolyTBAMS has a molecular weight Mw in the range of from of 50,000 g/mol to 100,000 g/mol, preferably in the range of from 1,000 to 90,000 g/mol, more preferred in the range of from 5,000 to 80,000 g/mol.

According to another embodiment of the polymer having improved antibacterial properties, the precursor material is a solution of the compound of general formula (III) in a solvent

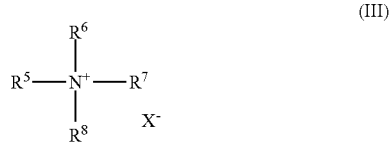

(III)

wherein $R^5$, $R^6$, $R^7$ and $R^8$ are independently selected from a group consisting of straight or branched alkyl of from 1 to 20 carbon atoms, preferably from 1 to 18 carbon atoms, preferably $R^8$ is hexyl and $R^5$, $R^6$, $R^7$ are methyl or ethyl; unsubstituted or substituted phenyl, preferably phenyl; benzyl; or wherein $R^5$ and $R^6$ are joined together with $N^+$ to form a six membered ring and $R^7$, $R^8$ are straight or branched alkyl of from 1 to 20 carbon atoms or a bond;
  wherein $X^-$ is selected from the group consisting of a halide, preferably chloride or bromide, sulfonate, sulfate, acetate and carboxylate, preferably acetate.
  and wherein the solvent is an alcohol, another polar solvent or water,
  wherein the compound of general formula (I) is preferably selected from the group consisting of hexadecyltrimethylammonium chloride (CTAB), benzalkonium chloride (BAC), hexadecylpyridinium chloride (HDPC), octadecyl dimethyl (3-triethoxysilylpropyl) ammonium chloride and mixtures of two or more of these compounds;
  wherein the alcohol or other polar solvent has a $\log_{KOW}$ in the range from −3 to +1, wherein the solvent can dissolve the quarternary ammonium salt at concentrations above 10 wt %. The alcohol is preferably selected from the group of branched or unbranched C1 to C10 alkanols, preferably from the group of branched or unbranched C1 to C5 mono- or diols.

According to one embodiment of the polymer having improved antibacterial properties, the polymer substrate is cellulose or a homopolymer or copolymer selected from the group consisting of a thermoset, a thermoplastic, an elastomer and a thermoplastic elastomer, preferably a thermoplastic or a thermoplastic elastomer selected from the group consisting of thermoplastic polyurethane (TPU), poly(ether sulfone) (PESU), polyethylene (PE), polypropylene (PP), cellulose triacetate (TAC), polyamide (PA), polyester (PES), polylactic acid (PLA), polybutylene adipate terephthalate (PBAT), polyolefins (PO), polyvinyl chloride (PVC), polystyrene (PS), polycarbonate (PC), polyketone, poly(methyl methacrylate) (PMMA), polyoxymethylene (POM), polyphenylene oxide (PPE), polyacrylate, poly acrylamide, silicone, and any blend of two or more thereof; preferably from the group consisting of TPU, PA, PES, PO, PS, PC, TAC, silicone, and any blend of two or more thereof; more preferably from the group consisting of TPU, PA, silicone, and any blend of two or more thereof; more preferably TPU and/or silicones.

According to one embodiment of the polymer having improved antibacterial properties, the thermoplastic polyurethane is obtained or obtainable by reaction of (i) at least one poly isocyanate composition, (ii) at least one chain extender composition and (iii) at least one polyol composition.

According to one embodiment of the polymer having improved antibacterial properties, the poly isocyanate composition (i) comprises at least one poly isocyanate selected from the group consisting of diphenylene methane diisocyanate (MDI), toluene diisocyanate (TDI), hexamethylene diisocyanate (HDI), and dicyclohexylene methane-4,4'-diisocyanate (H12MDI), and comprises preferably at least MDI, H12MDIor HDI. According to one embodiment of the polymer having improved antibacterial properties, the chain extender composition (ii) comprises at least a diol (D1), wherein the diol D1 is selected from the group consisting of ethane diol, butane diol, and hexane diol; and is preferably 1,4-butane diol. According to one embodiment of the polymer having improved antibacterial properties, the polyol composition (iii) comprises at least one diol (C1), which is preferably a polyether-based diol or a polyester-based diol, for instance poly tetrahydrofurane (pTHF), wherein the pTHF has preferably a number average molecular weight $M_n$ in the range of from 500 to 3000 g/mol, preferably in the range of from 1000 to 2000 g/mol.

According to one embodiment of the polymer having improved antibacterial properties, the thermoplastic polyurethane is obtained or obtainable by reaction of (i) a poly isocyanate composition, (ii) a chain extender composition and (iii) a polyol composition, wherein the poly isocyanate composition (i) comprises at least MDI or HDI; the chain extender composition (ii) comprises at least 1,4-butane diol; and the polyol composition (iii) comprises at least pTHF.

According to one embodiment of the polymer having improved antibacterial properties, the silicone is obtained or obtainable by the hydrolysis of organic chlorosilanes by water.

According to one embodiment of the polymer having improved antibacterial properties, the polymer substrate is a thermoplastic polyurethane or a silicone part, for example film, foil, belt, plate, fiber, fabric, fleece, foam, membrane, pellets, powder, tubing, or pipe, preferably a thermoplastic polyurethane film, foil, belt, membrane or tubing.

According to one embodiment of the polymer having improved antibacterial properties, the polymer substrate is a thermoplastic polyurethane or a silicone part, for example film, foil, belt, plate, fiber, foam, membrane, pellets, powder, tubing, or pipe, preferably a thermoplastic polyurethane film, foil, belt, membrane or tubing.

The use of the polymer having improved antibacterial and/or antiviral properties, preferably antibacterial and antiviral properties The present invention also relates to the use of the polymer having improved antibacterial and/or antiviral properties, preferably antibacterial and antiviral properties according as described above or of the polymer having improved antibacterial and/or antiviral properties, preferably antibacterial and antiviral properties obtained or obtainable by a method as described above, for medical applications, antibiofouling applications, hygiene applications, food industry applications, industrial or computer related applications, consumer goods applications and appliances, public and public transport applications, underwater, water sanitation or seawater applications; wherein:

the medical application is preferably a medical device, preferably a catheter, more preferably urinary catheter; a membrane, preferably dialysis membrane; a hemocompatibility device; a diagnostic device; a monitoring device; a prosthetic device; a therapeutic device; a dental device; a medical instrumentation and accessory; a cell and tissue culture device; a hematology device; a plaster; or a wound dressing or coverage product or a face mask;

the antibiofouling application is preferably a bacteria-repellant and/or antimicrobial membrane, part of an air conditioner, or part of a filtration system; a sea streamer cable, or part of an aqua culture;

the hygiene application is preferably a hygienic product, which is preferably workwear; a soap or disinfection dispenser; an article for interior hospital areas, preferably an article for a wall, floor, ceiling, furniture or worktop; general hospital and personal use device; medical instrumentation; medical accessory; laboratory equipment; general hospital device; or personal device; a public and public transport applications e.g. may comprise handrails, grip pole/handle/bar, seats, tables, toilets, showers the food industry application is preferably part of a conveyors belt, especially for transportation of food; totality or part of food packaging; surface of a device used in food industry, especially surface of wall, floor, ceiling, furniture, kitchen utensil, worktop, chopping board, work-wear, sack holder or soap dispenser; part of a drink bottle, part of a beverage dispenser, or part of storage and/or transportation equipment;

the industrial application may comprise general textile applications, preferably for a functional textile article; or furniture articles;

the consumer goods applications and appliances may comprise objects and accessories, as well as electrical or mechanical machines, used for domestic (cooking, cleaning), sports, or any other everyday life occupation.

the computer related application is preferably a keypad or a part of computer equipment, or a telephone;

the underwater, water sanitation or seawater applications may comprise seawater streamer cables and other underwater equipment, as well as any part or totality of device for cleaning water.

The present invention is further illustrated by the following embodiments and combinations of embodiments as indicated by the respective dependencies and back-references. In particular, it is noted that in each instance where a range of embodiments is mentioned, for example in the context of a term such as "The . . . of any of embodiments 1 to 4", every embodiment in this range is meant to be explicitly disclosed for the skilled person, i.e. the wording of this term is to be understood by the skilled person as being synonymous to "The . . . of any of embodiments 1, 2, 3, and 4".

1. A method for preparation of a polymer material having improved antibacterial properties comprising:
    a.) providing a polymer substrate having a surface;
    b.) generating a plasma under near atmospheric conditions by passing a carrier gas through an excitation zone and by applying high frequency alternating current to an electrode positioned in the excitation zone to produce a dielectrical barrier discharge thereby generating an atmospheric plasma;
    c.) generating a precursor material aerosol in a separate zone by using an atomiser gas or providing a gaseous precursor material, wherein the precursor material is a compound capable of forming radicals when in contact with an atmospheric plasma and which comprises at least one amine function;
    d.) treating at least a part of the polymer substrate surface provided according to (a) with the atmospheric plasma generated according to (b) and the precursor material aerosol generated according to (c) or the gaseous precursor material provided according to (c) thereby depositing a reaction product of the precursor material at least on a part of the polymer substrate surface.

2. A method for preparation of a polymer material having improved antibacterial and/or antiviral, preferably antibacterial and antiviral, properties comprising:
    a) providing a polymer substrate having a surface;
    b) generating a plasma under near atmospheric conditions by passing a carrier gas through an excitation zone and by applying high frequency alternating current to an electrode positioned in the excitation zone to produce a dielectrical barrier discharge thereby generating an atmospheric plasma;
    c) generating a precursor material aerosol in a separate zone by using an atomiser gas or providing a gaseous precursor material, wherein the precursor material is a compound capable of forming radicals when in contact with an atmospheric plasma and which comprises at least one amine function;
    d) treating at least a part of the polymer substrate surface provided according to (a) with the atmospheric plasma generated according to (b) and the precursor material aerosol generated according to (c) or the gaseous precursor material provided according to (c) thereby depositing a reaction product of the precursor material at least on a part of the polymer substrate surface.

3. The method according to embodiment 1 or 2, wherein (d) comprises:
    d.1) treating the polymer substrate surface provided according to (a) with the atmospheric plasma generated according to (b);
    d.2a) introducing the precursor material aerosol generated according to (c) or the gaseous precursor material provided according to (c) into the atmospheric plasma used in (d.1), thereby forming an atmospheric plasma comprising the precursor material; or
    d.2b) treating the polymer substrate surface directly after step (d.1) in the "afterglow" with the precursor material aerosol generated according to (c) or with the gaseous precursor material provided according to (c).

4. The method according to any one of embodiments 1 to 3, wherein all steps (a) to (d) take place at atmospheric pressure, preferably at a pressure in the range of from 0.5 to 1.5 bar, more preferably in the range of from 0.8 to 1.2 bar, more preferably in the range of from 0.9 to 1.1 bar.

5. The method according to any of embodiments 1 to 4, wherein the precursor material is a compound capable of forming radicals when in contact with an atmospheric plasma and which contains at least one amine function selected from the group of primary, secondary, tertiary amines and quarternary ammonium salts, preferably from the group consisting of primary, secondary amines and quarternary ammonium salts, more preferably from the group consisting of primary and secondary amines; or from the group consisting of secondary ammines and quaternary ammonium salts, more preferred quaternary ammonium salts.

6. The method according to any of embodiments 1 to 5, wherein the precursor material is a compound of general formula (I)

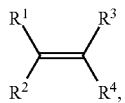
(I)

wherein
R¹ and R² are independently selected from the group consisting of hydrogen atom, halogen atom, CN, CF$_3$, straight or branched alkyl of from 1 to 20 carbon atoms, preferably from 1 to 6 carbon atoms, more preferably from 1 to 4 carbon atoms, a $(CH_2)_x$—$(CF_2)_y$—$CF_3$ group with x being zero or an integer in the range from 1 to 6 and y being an integer in the range from 1 to 20, preferably a $(CH_2)_x$—$(CF_2)_y$—$CF_3$ group with x being zero or an integer in the range from 1 to 4 and y being an integer in the range from 3 to 18; or a —(C1 to C10-alkylene-O—)$_n$—C1 to C5 alkyl or a —(C1 to C10-alkylene-O—)$_n$—H group with n being an integer in the range of 1 to 80, preferably a —(C1 to C10-alkylene-O)$_n$—C1 to C5 alkyl group or a —((C1 to C10-alkylene-O—)$_n$—H group with n being an integer in the range of 1 to 25, more preferably a —(CH$_2$—CH$_2$—O—)n-CH$_3$-group or a —(CH$_2$—CH$_2$—O—)$_n$—H group with n being an integer in the range of 1 to 12, alpha, beta-unsaturated straight or branched alkenyl or alkynyl of 2 to 10 carbon atoms, preferably from 2 to 6 carbon atoms, more preferably from 2 to 4 carbon atoms, C5-C6 cycloalkyl, heterocycloalkyl, C(=Y)XR⁵, where Y may be S or O, preferably O, and X is O or a bond,
R⁵ is a straight or branched C1-C20 alkyl, a straight or branched C1-C20 alkoxy, a $(CH_2)_x$—$(CF_2)_y$—$CF_3$ group with x being an integer in the range from 0 to 6 and y being an integer in the range from 1 to 20, preferably R⁵ is a $(CH_2)_x$—$(CF_2)_y$—$CF_3$ group with x being zero or an integer in the range from 1 to 4 and y being an integer in the range from 3 to 18; or a —(C1 to C10-alkylene-O—)n-C1 to C5 alkyl or a —(C1 to C10-alkylene-O—)$_n$—H group with n being an integer in the range of 1 to 80, preferably a —(C1 to C10-alkylene-O)$_n$—C1 to C5 alkyl group or a —((C1 to C10-alkylene-O—)$_n$—H group with n being an integer in the range of 1 to 25, more preferably a —(CH$_2$—CH$_2$—O—)$_n$—CH$_3$-group or a —(CH$_2$—CH$_2$—O—)$_n$—H group with n being an integer in the range of 1 to 12;
R³ is selected from the group consisting of hydrogen atom, halogen atom, preferably fluorine or chlorine, C1-C6, preferably C1, alkyl and COOR⁶, where R⁶ is a hydrogen atom or a C1-C6 alkyl group;

or
R¹ and R³ may be joined to form a group of the formula (CH$_2$)$_m$, optionally substituted with one or more C1-C4 alkyl group(s), wherein m is an integer in the range of from 2 to 6, preferably 3 or 4; and
R⁴ is a primary or secondary amine group of the general formula (II)

(II)

wherein
z is selected from the group consisting of —(CH$_2$)$_x$—, wherein p is an integer in the range of from 1 to 10, preferably 1; —(C(=O)—O—(CH$_2$)$_y$—, wherein q is an integer in the range of from 1 to 10, preferably in the range of from 2 to 4, more preferably 2; and —(C$_6$H$_4$)—(CH$_2$)$_r$, wherein r is an integer in the range of from 1 to 10, preferably 1;
R$^{4a}$ is a hydrogen atom, an aryl group or a branched or unbranched C1 to C10 alkyl group;
R$^{4b}$ is a hydrogen or is selected from the group consisting of a branched or unbranched C1 to C18-alkyl group; a C1 to C6-alkyl-phenyl-R⁷ group, wherein R⁷ is a saturated or unsaturated, branched or unbranched C1 to C6-alkyl group;
wherein R$^{4a}$ and R$^{4h}$ preferably are both hydrogen atoms, or wherein R$^{4a}$ is preferably a hydrogen atom and R$^{4a}$ is a C2-C5 straight or branched alkyl, more preferable isopropyl or t-butyl, and more preferable tert-butyl.

7. The method according to any of embodiments 1 to 6?, wherein the precursor material is a compound of general formula (I)

(I)

wherein
R¹ and R² are independently selected from the group consisting of hydrogen atom, halogen atom, CN, CF$_3$, straight or branched alkyl of from 1 to 20 carbon atoms, preferably from 1 to 6 carbon atoms, more preferably from 1 to 4 carbon atoms, a $(CH_2)_x$—$(CF_2)_y$ CF$_3$ group with x being zero or an integer in the range from 1 to 6 and y being an integer in the range from 1 to 20, preferably a $(CH_2)_x$—$(CF_2)_y$—$CF_3$ group with x being zero or an integer in the range from 1 to 4 and y being an integer in the range from 3 to 18; or an alpha, beta-unsaturated straight or branched alkenyl or alkynyl of 2 to 10 carbon atoms, preferably from 2 to 6 carbon atoms, more preferably from 2 to 4 carbon atoms, C5-C6 cycloalkyl, heterocycloalkyl, C(=Y) XR⁵, where Y may be S or O, preferably O, and X is O or a bond,
R⁵ is a straight or branched C1-C20 alkyl, a straight or branched C1-C20 alkoxy, a $(CH_2)_x$—$(CF_2)_y$—$CF_3$ group with x being an integer in the range from 0 to 6 and y being an integer in the range from 1 to 20, preferably R⁵ is a $(CH_2)_r$—$(CF_2)_y$—$CF_3$ group with x being zero or an integer in the range from 1 to 4 and y being an integer in the range from 3 to 18;

R³ is selected from the group consisting of hydrogen atom, halogen atom, preferably fluorine or chlorine, C1-C6, preferably C1, alkyl and COOR⁶, where R⁶ is a C1-C6 alkyl group;

or

R¹ and R³ may be joined to form a group of the formula (CH₂)ₘ, optionally substituted with one or more C1-C4 alkyl group(s), wherein m is an integer in the range of from 2 to 6, preferably 3 or 4; and R⁴ is a primary or secondary amine group of the general formula (II)

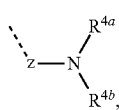

(II)

wherein z is selected from the group consisting of —(CH₂)ₓ—, wherein p is an integer in the range of from 1 to 10, preferably 1; —(C(=O)—O—(CH₂)_q—, wherein q is an integer in the range from 1 to 10, preferably in the range of from 2 to 4, more preferably 2; and —(C₆H₄)—(CH₂)ᵣ, wherein r is an integer in the range of from 1 to 10, preferably 1;

R⁴ᵃ is a hydrogen atom, an aryl group or a branched or unbranched C1 to C10 alkyl group;

R⁴ᵇ is a hydrogen or is selected from the group consisting of a branched or unbranched C1 to C18-alkyl group; a C1 to C6-alkyl-phenyl-R⁷ group, wherein R⁷ is a saturated or unsaturated, branched or unbranched C1 to C6-alkyl group;

wherein R⁴ᵃ and R⁴ᵇ preferably are both hydrogen atoms, or wherein R⁴ᵃ is preferably a hydrogen atom and R⁴ᵇ is a C2-C5 straight or branched alkyl, more preferable isopropyl or t-butyl, and more preferable tert-butyl.

8. The method according to embodiment 6 or 7, wherein the compound of general formula (I) is selected from the group consisting of allyl amine, t-butylaminoethyl methacrylate (TBAEMA), t-butylaminomethyl methacrylate, t-butylaminopropyl methacrylate, t-butylaminoethyl acrylate, t-butylaminomethyl acrylate, t-butylaminopropyl acrylate, t-butylaminoethyl acrylamide, t-butylaminomethyl acrylamide, t-butylaminopropyl acrylamide, t-butylaminoethyl methacrylamide, t-butylaminomethyl methacrylamid, t-butylaminopropyl methacrylamide, tert-butyl aminomethyl styrene (TBAMS) and poly TBAMS; more preferably from the group consisting of allyl amine, TBAEMA, TBAMS, and poly TBAMS, more preferably allyl amine and TBAEMA, or from the group consisting of tridecafluorooctyl acrylate (TFOA), methacrylic ester of methylpolyethyleneglycol (MPEG 350 MA) and 2-hydroxyethylmethacrylate (HEMA), more preferably TFOA.

9. The method according to any of embodiments 1 to 8, wherein the precursor material is a solution of the compound of general formula (III) in a solvent

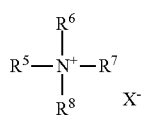

(III)

wherein R⁵, R⁶, R⁷ and R⁸ are independently selected from a group consisting of straight or branched alkyl of from 1 to 20 carbon atoms, preferably from 1 to 18 carbon atoms, preferably R⁸ is hexyl and R⁵, R⁶, R⁷ are methyl or ethyl; unsubstituted or substituted phenyl, preferably phenyl; benzyl; or wherein R⁵ and R⁶ are joined together with N⁺ to form a six membered ring and R⁷, R⁸ are straight or branched alkyl of from 1 to 20 carbon atoms or a bond;

wherein X⁻ is selected from the group consisting of a halide, preferably chloride or bromide; sulfonate; sulfate; acetate and carboxylate, preferably acetate.

and wherein the solvent is an alcohol, another polar solvent or water, wherein the compound of general formula (III) is preferably selected from the group consisting of hexadecyltrimethylammonium chloride (CTAB), benzalkonium chloride (BAC), hexadecylpyridinium chloride (HDPC), octadecyl dimethyl (3-triethoxysilylpropyl) ammonium chloride and mixtures of two or more of these compounds;

wherein the alcohol, or the polar solvent has a $\log_{KOW}$ in the range from −3 to +1; and wherein the solvent can preferably dissolve the quarternary ammonium salt at concentrations above 10 wt %.

10. The method according to any of embodiments 1 to 9, wherein the polymer substrate is a homo-polymer or copolymer selected from the group consisting of a thermoset, a thermoplastic, an elastomer and a thermoplastic elastomer, preferably a thermoplastic or a thermoplastic elastomer selected from the group consisting of thermoplastic polyurethane (TPU), poly(ether sulfone) (PESU), polyethylene (PE), polypropylene (PP), cellulose triacetate (TAC), polyamide (PA), polyester (PES), polylactic acid (PLA), polybutylene adipate terephthalate (PBAT), polyolefins (PO), polyvinyl chloride (PVC), polystyrene (PS), polycarbonate (PC), polyketone, poly(methyl methacrylate) (PMMA), polyoxymethylene (POM), polyphenylene oxide (PPE), polyacrylate, poly acrylamide, silicone, and any blend of two or more thereof; preferably from the group consisting of TPU, PA, PES, PO, PS, PC, TAC,silicone, and any blend of two or more thereof; more preferably from the group consisting of TPU, PA, silicone, and any blend of two or more thereof; more preferably TPU and/or silicone.

11. The method according to any of embodiments 1 to 10, wherein the thermoplastic polyurethane is obtained or obtainable by reaction of (i) at least one poly isocyanate composition, (ii) at least one chain extender composition and (iii) at least one polyol composition.

12. The method according to embodiment 11, wherein the poly isocyanate composition (i) comprises at least one poly isocyanate selected from the group consisting of diphenylene methane diisocyanate (MDI), toluene diisocyanate (TDI), hexamethylene diisocyanate (HDI), and dicyclohexylene methane-4,4'-diisocyanate (H12MDI), and comprises preferably at least MDI, H12MDI or HDI.

13. The method according to embodiment 11 or 12, wherein the chain extender composition (ii) comprises at least a diol (D1), wherein the diol D1 is selected from the group consisting of ethane diol, butane diol, and hexane diol; and is preferably 1,4-butane diol.

14. The method according to any of embodiments 11 to 13, wherein the polyol composition (iii) comprises at least one diol (C1), which is preferably a polyether-based or a polyester-based diol, more preferred poly tetrahydrofurane (pTHF), wherein the pTHF has preferably a number average molecular weight $M_n$ in the range of from 500 to 3000 g/mol, preferably in the range of from 1000 to 2000 g/mol.

15. The method according to any of embodiments 10 to 14, wherein the thermoplastic polyurethane is obtained or obtainable by reaction of (i) a poly isocyanate composition, (ii) a chain extender composition and (iii) a polyol composition, wherein the poly isocyanate composition (i) comprises at least MDI or HDI;

the chain extender composition (ii) comprises at least 1,4-butane diol; and he polyol composition (iii) comprises at least pTHF.

16. The method according to any of embodiments 10 to 15, wherein the silicone is obtained or obtainable by the hydrolysis of organic chlorosilanes by water.

17. The method according to embodiment 10 wherein the polymer substrate is a thermoplastic polyurethane or a silicone part, preferably film, foil, belt, plate, fiber, fabric, fleece, foam, membrane, pellets, powder, tubing, or pipe, preferably a thermoplastic polyurethane film, foil, belt, membrane or tubing.

18. The method according to embodiment 10 wherein the polymer substrate is a thermoplastic polyurethane or a silicone part, preferably film, foil, belt, plate, fiber, foam, membrane, pellets, powder, tubing, or pipe, preferably a thermoplastic polyurethane film, foil, belt, membrane or tubing.

19. A polymer substrate having deposited on its surface a reaction product of a precursor material obtained or obtainable by the method according to any of embodiment 1 to 18.

20. A polymer having improved antibacterial properties and/or antiviral properties, preferably antibacterial and antiviral properties, obtained or obtainable by a method comprising:
a) providing a polymer substrate having a surface;
b) generating a plasma under atmospheric conditions by passing a carrier gas through an excitation zone and by applying high frequency alternating current to an electrode positioned in the excitation zone to produce a discharge thereby generating an atmospheric plasma;
c) generating a precursor material aerosol in a separate zone or providing a gaseous precursor material, wherein the precursor material is a compound capable of forming radicals when in contact with an atmospheric plasma;
d) treating at least a part of the polymer substrate surface provided according to (a) with the atmospheric plasma generated according to (b) and the precursor material aerosol generated according to (c) or the gaseous precursor material provided according to (c) thereby depositing a reaction product of the precursor material at least on a part of the polymer substrate surface.

21. The polymer having improved antibacterial properties and/or antiviral properties, preferably antibacterial and antiviral properties, according to embodiment 20, wherein (d) comprises:
d.1) treating the polymer substrate surface provided according to (a) with the atmospheric plasma generated according to (b);
d.2a) introducing the precursor material aerosol generated according to (c) or the gaseous precursor material provided according to (c) into the atmospheric plasma used in (d.1), thereby forming an atmospheric plasma comprising the precursor material; or
d.2b) treating the polymer substrate surface directly after step (d.1) with the precursor material aerosol generated according to (c) or the gaseous precursor material provided according to (c).

22. The polymer having improved antibacterial properties according to embodiment 20 or 21, wherein all steps (a) to (d) take place at near atmospheric pressure, preferably at a pressure in the range of from 0.5 to 1.5 bar, more preferably in the range of from 0.8 to 1.2 bar, more preferably in the range of from 0.9 to 1.1 bar.

23. The polymer having improved antibacterial properties according to any of embodiments 20 to 22, wherein the precursor material is a compound capable of forming radicals when in contact with an atmospheric plasma and which contains at least one amine function elected from the group of primary, secondary, tertiary amines and quarternary ammonium salts, preferably from the group consisting of primary, secondary amines and quarternary ammonium salts, more preferably from the group consisting of primary and secondary amines.

24. The polymer having improved antibacterial properties and/or antiviral properties, preferably antibacterial and antiviral properties, according to any of embodiments 20 to 23 wherein the precursor material is a compound of general formula (I)

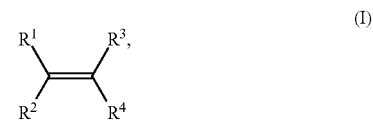

wherein
$R^1$ and $R^2$ are independently selected from the group consisting of hydrogen atom, halogen atom, CN, $CF_3$, straight or branched alkyl of from 1 to 20 carbon atoms, preferably from 1 to 6 carbon atoms, more preferably from 1 to 4 carbon atoms, a $(CH_2)_x$—$(CF_2)_y$—$CF_3$ group with x being zero or an integer in the range from 1 to 6 and y being an integer in the range from 1 to 20, preferably a $(CH_2)_x$—$(CF_2)_y$—$CF_3$ group with x being zero or an integer in the range from 1 to 4 and y being an integer in the range from 3 to 18; or a —(C1 to C10-alkylene-O—)$_n$—C1 to C5 alkyl or a —(C1 to C10-alkylene-O—)$_n$—H group with n being an integer in the range of 1 to 80, preferably a —(C1 to C10-alkylene-O)$_n$—C1 to C5 alkyl group or a —((C1 to C10-alkylene-O—)$_n$—H group with n being an integer in the range of 1 to 25, more preferably a —(CH$_2$—CH$_2$—O—)$_n$—CH$_3$-group or a —(CH$_2$—CH$_2$—O—)$_n$—H group with n being an integer in the range of 1 to 12, alpha, beta-unsaturated straight or branched alkenyl or alkynyl of 2 to 10 carbon atoms, preferably from 2 to 6 carbon atoms, more preferably from 2 to 4 carbon atoms, C5-C6 cycloalkyl, heterocycloalkyl, C(=Y)XR$^5$, where Y may be S or O, preferably O, and X is O or a bond,
$R^5$ is a straight or branched C1-C20 alkyl, a straight or branched C1-C20 alkoxy, a $(CH_2)_x$—$(CF_2)_y$—$CF_3$ group with x being an integer in the range from 0 to 6 and y being an integer in the range from 1 to 20, preferably R$^5$ is a $(CH_2)_x$—$(CF_2)_y$—$CF_3$ group with x being zero or an integer in the range from 1 to 4 and y being an integer in the range from 3 to 18; or a —(C1 to C10-alkylene-O—)$_n$—C1 to C5 alkyl or a —(C1 to C10-alkylene-O—)$_n$—H group with n being an integer in the range of 1 to 80, preferably a —(C1 to C10-alkylene-O)$_n$—C1 to C5 alkyl group or a —((C1 to C10-alkylene-O—)$_n$—H group with n being an integer in the range of 1 to 25, more preferably a —(CH$_2$—

CH$_2$—O—)$_n$—CH$_3$-group or a —(CH$_2$—CH$_2$—O—)$_n$—H group with n being an integer in the range of 1 to 12;

R$^3$ is selected from the group consisting of hydrogen atom, halogen atom, preferably fluorine or chlorine, C1-C6, preferably C1, alkyl and COOR$^6$, where R$^6$ is a hydrogen atom or a C1-C6 alkyl group;

or

R$^1$ and R$^3$ may be joined to form a group of the formula (CH$_2$)$_m$, optionally substituted with one or more C1-C4 alkyl group(s), wherein m is an integer in the range of from 2 to 6, preferably 3 or 4;

R$^4$ is a primary or secondary amine group of the general formula (II)

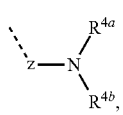

(II)

wherein z is selected from the group consisting of —(CH$_2$)$_p$—, wherein p is an integer in the range of from 1 to 10, preferably 1; —(C(=O)—O—(CH$_2$)$_q$—, wherein q is an integer in the range of from 1 to 10, preferably in the range of from 2 to 4, more preferably 2; and —(C$_6$H$_4$)—(CH$_2$)$_r$, wherein r is an integer in the range of from 1 to 10, preferably 1;

R$^{4a}$ is a hydrogen atom, an aryl group or a branched or unbranched C1 to C10 alkyl group;

R$^{4b}$ is a hydrogen atom or is selected from the group consisting of a branched or unbranched C1 to C18-alkyl group; a C1 to C6-alkyl-phenyl-R$^7$ group, wherein R$^7$ is a saturated or unsaturated, branched or unbranched C1 to C6-alkyl group;

wherein R$^{4a}$ and R$^{4b}$ preferably are both hydrogen atoms, or wherein R$^{4a}$ is preferably a hydrogen atom and R$^{4b}$ is a C2-C5 straight or branched alkyl, more preferable isopropyl or t-butyl, and more preferable tert-butyl.

25. The polymer having improved antibacterial properties and/or antiviral properties, preferably antibacterial and antiviral properties, according to any of embodiments 20 to 23 wherein the precursor material is a compound of general formula (I)

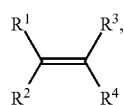

(I)

wherein

R$^1$ and R$^2$ are independently selected from the group consisting of hydrogen atom, halogen atom, CN, CF$_3$, straight or branched alkyl of from 1 to 20 carbon atoms, preferably from 1 to 6 carbon atoms, more preferably from 1 to 4 carbon atoms, a (CH$_2$)$_x$—(CF$_2$)$_y$—CF$_3$ group with x being zero or an integer in the range from 1 to 6 and y being an integer in the range from 1 to 20, preferably a (CH$_2$)$_x$—(CF$_2$)$_y$—CF$_3$ group with x being zero or an integer in the range from 1 to 4 and y being an integer in the range from 3 to 18; or an alpha, beta-unsaturated straight or branched alkenyl or alkynyl of 2 to 10 carbon atoms, preferably from 2 to 6 carbon atoms, more preferably from 2 to 4 carbon atoms, C5-C6 cycloalkyl, heterocycloalkyl, C(=Y)XR$^5$, where Y may be S or O, preferably O, and X is O or a bond, R$^5$ is a straight or branched C1-C20 alkyl, a straight or branched C1-C20 alkoxy, a (CH$_2$)$_x$—(CF$_2$)$_y$—CF$_3$ group with x being an integer in the range from 0 to 6 and y being an integer in the range from 1 to 20, preferably R$^5$ is a (CH$_2$)$_x$—(CF$_2$)$_y$—CF$_3$ group with x being zero or an integer in the range from 1 to 4 and y being an integer in the range from 3 to 18;

R$^3$ is selected from the group consisting of hydrogen atom, halogen atom, preferably fluorine or chlorine, C1-C6, preferably C1, alkyl and COOR6, where R$^6$ is a C1-C6 alkyl group;

or

R$^1$ and R$^3$ may be joined to form a group of the formula (CH$_2$)$_m$, optionally substituted with one or more C1-C4 alkyl group(s), wherein m is an integer in the range of from 2 to 6, preferably 3 or 4;

R$^4$ is a primary or secondary amine group of the general formula (II)

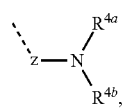

(II)

wherein z is selected from the group consisting of —(CH$_2$)$_x$—, wherein p is an integer in the range of from 1 to 10, preferably 1; —(C(=O)—O—(CH$_2$)$_q$—, wherein q is an integer in the range of from 1 to 10, preferably in the range of from 2 to 4, more preferably 2; and —(C$_6$H$_4$)—(CH$_2$)$_r$, wherein r is an integer in the range of from 1 to 10, preferably 1;

R$^{4a}$ is a hydrogen atom, an aryl group or a branched or unbranched C1 to C10 alkyl group;

R$^{4b}$ is a hydrogen atom or is selected from the group consisting of a branched or unbranched C1 to C18-alkyl group; a C1 to C6-alkyl-phenyl-R$^7$ group, wherein R$^7$ is a saturated or unsaturated, branched or unbranched C1 to C6-alkyl group;

wherein R$^{4a}$ and R$^{4b}$ preferably are both hydrogen atoms, or wherein R$^{4a}$ is preferably a hydrogen atom and R$^{4b}$ is a C2-C5 straight or branched alkyl, more preferable isopropyl or t-butyl, and more preferable tert-butyl.

26. The polymer having improved antibacterial properties and/or antiviral properties, preferably antibacterial and antiviral properties, according to embodiment 24 or 25, wherein the compound of general formula (I) is selected from the group consisting of allyl amine, t-butylaminoethyl methacrylate (TBAEMA), t-butylaminomethyl methacrylate, t-butylaminopropyl methacrylate, t-butylaminoethyl acrylate, t-butylaminomethyl acrylate, t-butylaminopropyl acrylate, t-butylaminoethyl acrylamide, t-butylaminomethyl acrylamide, t-butylaminopropyl acrylamide, t-butylaminoethyl methacrylamide, t-butylaminomethyl methacrylamid, t-butylaminopropyl methacrylamide, tert-butyl aminomethyl styrene (TBAMS) and poly TBAMS; more preferably from the group consisting of allyl amine, TBAEMA, TBAMS, and poly TBAMS, more preferably allyl amine and TBAEMA, or from the group consisting of tridecafluorooctyl acrylate (TFOA), methacrylic ester of methylpolyethyleneglycol (MPEG 350 MA) and 2-hydroxyethylmethacrylate (HEMA), more preferably TFOA.

27. The polymer having improved antibacterial properties and/or antiviral properties, preferably antibacterial and antiviral properties, according to any of embodiments 20 to 23, wherein the precursor material is a solution of the compound of general formula (III) in a solvent

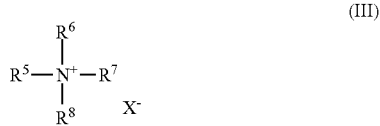

wherein $R^5$, $R^6$, $R^7$ and $R^8$ are independently selected from a group consisting of straight or branched alkyl of from 1 to 20 carbon atoms, preferably from 1 to 18 carbon atoms, preferably $R^8$ is hexyl and $R^5$, $R^6$, $R^7$ are methyl or ethyl; unsubstituted or substituted phenyl, preferably phenyl; benzyl; or wherein $R^5$ and $R^6$ are joined together with $N^+$ to form a six membered ring and $R^7$, $R^8$ are straight or branched alkyl of from 1 to 20 carbon atoms or a bond;
wherein $X^-$ is selected from the group consisting of a halide, preferably chloride or bromide; sulfonate; sulfate; acetate; and carboxylate, preferably acetate,
and wherein the solvent is an alcohol, another polar solvent or water,
wherein the compound of general formula (III) is preferably selected from the group consisting of hexadecyltrimethylammonium chloride (CTAB), benzalkonium chloride (BAC), hexadecylpyridinium chloride (HDPC), octadecyl dimethyl (3-triethoxysilylpropyl) ammonium chloride and mixtures of two or more of these compounds;
wherein the alcohol or other polar solvent has a $\log_{KOW}$ in the range from −3 to +1, and wherein the solvent can preferably dissolve the quarternary ammonium salt at concentrations above 10 wt %.

28. The polymer having improved antibacterial properties and/or antiviral properties, preferably antibacterial and antiviral properties, according to any of embodiments 20 to 27, wherein the polymer substrate is a homopolymer or copolymer selected from the group consisting of a thermoset, a thermoplastic, an elastomer and a thermoplastic elastomer, preferably a thermoplastic or a thermoplastic elastomer selected from the group consisting of thermoplastic polyurethane (TPU), poly(ether sulfone) (PESU), polyethylene (PE), polypropylene (PP), cellulose triacetate (TAC), polyamide (PA), polyester (PES), polylactic acid (PLA), polybutylene adipate terephthalate (PBAT), polyolefins (PO), polyvinyl chloride (PVC), polystyrene (PS), polycarbonate (PC), polyketone, poly(methyl methacrylate) (PMMA), polyoxymethylene (POM), polyphenylene oxide (PPE), polyacrylate, poly acrylamide, silicone, and any blend of two or more thereof; preferably from the group consisting of TPU, PA, PES, PO, PS, PC, TAC, silicone, and any blend of two or more thereof; more preferably from the group consisting of TPU, PA, silicone, and any blend of two or more thereof; more preferably TPU and/or silicone.

29. The polymer having improved antibacterial properties and/or antiviral properties, preferably antibacterial and antiviral properties, according to embodiment 28, wherein the silicone is obtained or obtainable by the hydrolysis of organic chlorosilanes by water.

30. The polymer having improved antibacterial properties and/or antiviral properties, preferably antibacterial and antiviral properties, according to embodiment 28, wherein the thermoplastic polyurethane is obtained or obtainable by reaction of (i) at least one poly isocyanate composition, (ii) at least one chain extender composition and (iii) at least one polyol composition.

31. The polymer having improved antibacterial properties and/or antiviral properties, preferably antibacterial and antiviral properties, according to embodiment 30, wherein the poly isocyanate composition (i) comprises at least one poly isocyanate selected from the group consisting of diphenylene methane diisocyanate (MDI), toluene diisocyanate (TDI), hexamethylene diisocyanate (HDI), and dicyclohexylene methane-4,4'-diisocyanate (H12MDI), and comprises preferably at least MDI, H12MDI or HDI.

32. The polymer having improved antibacterial properties and/or antiviral properties, preferably antibacterial and antiviral properties, according to embodiment 30 or 31, wherein the chain extender composition (ii) comprises at least a diol (D1), wherein the diol D1 is selected from the group consisting of ethane diol, butane diol, and hexane diol; and is preferably 1,4-butane diol.

33. The polymer having improved antibacterial properties and/or antiviral properties, preferably antibacterial and antiviral properties according to any of embodiments 30 to 32, wherein the polyol composition (iii) comprises at least one diol (C1), which is preferably a polyether-based or a polyester-based diol, more preferred poly tetrahydrofurane (pTHF), wherein the pTHF has preferably a number average molecular weight $M_n$ in the range of from 500 to 3000 g/mol, preferably in the range of from 1000 to 2000 g/mol.

34. The polymer having improved antibacterial properties and/or antiviral properties, preferably antibacterial and antiviral properties, according to any of embodiments 30 to 33, wherein the thermoplastic polyurethane is obtained or obtainable by reaction of (i) a poly isocyanate composition, (ii) a chain extender composition and (iii) a polyol composition, wherein the poly isocyanate composition (i) comprises at least MDI or HDI;
the chain extender composition (ii) comprises at least 1,4-butane diol; and the polyol composition (iii) comprises at least pTHF.

35. The polymer having improved antibacterial properties and/or antiviral properties, preferably antibacterial and antiviral properties, according to any of embodiments 20 to 34, wherein the polymer substrate is a thermoplastic polyurethane or a silicone part, preferably film, foil, belt, plate, fiber, fabric, fleece, foam, membrane, pellets, powder, tubing, or pipe, preferably a thermoplastic polyurethane film, foil, belt, membrane or tubing.

36. The polymer having improved antibacterial properties and/or antiviral properties, preferably antibacterial and antiviral properties, according to any of embodiments 20 to 34, wherein the polymer substrate is a thermoplastic polyurethane or a silicone part, preferably film, foil, belt, plate, fiber, fabric, fleece, foam, membrane, pellets, powder, tubing, or pipe, preferably a thermoplastic polyurethane film, foil, belt, membrane or tubing.

37. Use of the polymer having improved antibacterial properties and/or antiviral properties, preferably antibacterial and antiviral properties, according to any of embodiments 20 to 36 or of the polymer having improved antibacterial properties obtained or obtainable by a method according to any of embodiments 1 to 17, for medical applications, antibiofouling applications, hygiene applications, food industry applications, industrial or computer related applications, consumer goods applications and appliances, public and public transport applications, underwater, water sanitation or seawater applications; wherein: the medical application is preferably a medical device, preferably a catheter, more preferably urinary catheter; a membrane, preferably dialysis membrane; a hemocompatibility device; a diagnostic device; a monitoring device; a prosthetic device; a therapeutic device; a dental device; a medical instrumentation and accessory; a cell and tissue culture device; a hematology device; a plaster; or a wound dressing or coverage product;

the antibiofouling application is preferably a bacteria-repellant and/or antimicrobial membrane, part of an air conditioner, or part of a filtration system; a sea streamer cable, or part of an aqua culture;

the hygiene application is preferably a hygienic product, which is preferably workwear or a face mask; a soap or disinfection dispenser; an article for interior hospital areas, preferably an article for a wall, floor, ceiling, furniture or worktop; general hospital and personal use device; medical instrumentation; medical accessory; laboratory equipment; general hospital device; or personal device; a public and public transport applications e.g. may comprise handrails, grip pole/handle/bar, seats, tables, toilets, showers the food industry application is preferably part of a conveyors belt, especially for transportation of food; totality or part of food packaging: surface of a device used in food industry, especially surface of wall, floor, ceiling, furniture, kitchen utensil, worktop, chopping board, work-wear, sack holder or soap dispenser; part of a drink bottle, part of a beverage dispenser, or part of storage and/or transportation equipment;

the industrial application may comprise general textile applications, preferably for a functional textile article; or furniture articles;

the computer related application is preferably a keypad or a part of computer equipment, or a telephone;

the underwater, water sanitation or seawater applications may comprise seawater streamer cables and other underwater equipment.

The present invention is further illustrated by the following reference examples, comparative examples, and examples.

EXAMPLES

1. Chemicals 1.1 TPUs
TPU 1:
The thermoplastic polyurethane (TPU) used for this example was a polyether grade obtained from the reaction of 4,4'-methylenediphenyl diisocyanate and 1,4-butanediol as components of the urethane-rich hard blocks, and polytetrahydrofuran (polyether) macrodiol, with Mn ~1000 g/mol and polydispersity index of ~2, as the main component of the soft phase. The hard block content was 22 weight-% and the glass transition temperature was −50° C.
Extrusion:
The TPU foils were obtained by an extrusion process with a single screw extruder, diameter=45 mm and a length of 30 D using 3 zone screw with a compression ratio of 1:2,5 and at temperatures between 150° and 205° C. ("length of 30 D" means that the length is 30 times the diameter of the screw, i.e. 135 cm). A slit die is installed at the end of the extruder to obtain the TPU foil. For the tests the thickness was not crucial as long as the foil was continuous (without holes) and thin enough to pass through the electrode gap.
TPU 2:
The thermoplastic polyurethane (TPU) used for this example was a polyether grade obtained from the reaction of 4,4'-methylenediphenyl diisocyanate and 1,4-butanediol as components of the urethane-rich hard blocks, and polytetrahydrofuran (polyether) macrodiol, with Mn ~1000 g/mol and polydispersity index of ~2, as the main component of the soft phase. The hard block content was 22-23 weight-% and the glass transition temperature was −40° C.
Extrusion and Moulding:
The TPU plates were obtained by an extrusion/injection molding process with a single screw extruder, diameter=45 mm and a length of 23 D using 3 zone screw with a compression ratio of 1:2,0 and at temperatures between 200° and 225° C. The mold temperature was 35° C.

1.2 Precursors for Coating
  TBAEMA: t-butylaminoethyl methacrylate
  TBAMS: tert-butyl aminomethyl styrene
  PTBAMS: Poly tert-butyl aminomethyl styrene
  Allylamine: 2-Propen-1-amine
  BAC: benzalkonium chloride
  HDPC: hexadecylpyridinium chloride
  CTAB: hexadecyltrimethylammonium chloride 2. Method A (PlasmaZone® Technology Developed by VITO (Mol, Belgium))

The plasma treatment was carried out in a direct plasma configuration in a parallel plate DBD (dielectric barrier discharge) plasma installation at atmospheric pressure using a discharge frequency of 1.5 kHz. The dimensions of the two high voltage electrodes are 340×80 mm and the interelectrode distance (gap) of the two electrodes is 2 mm. The upper electrode is mounted on an X-moving table which is moved at a linear speed of 2 m/min. A sheet of the substrate material (TPU according to section 1.1) was placed on the lower grounded electrode. The substrate was submitted to an argon plasma (carrier gas) at a flow of 10 slm (standard l/min) and at an input power of 100 W. The respective precursor for coating was injected as an aerosol in the plasma zone under an argon flow of 1-2 slm. The treatment time was varied by running multiple passes (10-20). In some cases, a plasma post curing was carried out after the coating deposition (see table).

3. Method B (PlasmaLine® Technology Developed by VITO (Mol, Belgium))

The plasma treatment was carried out in an indirect plasma configuration at atmospheric pressure. The plasma was blown out of the PlasmaLine® (PL200) using a flow of 250 slm nitrogen or argon to form a so-called plasma afterglow of 200 mm in width. The applied power to the system was 150 W in the case of argon and 400 W in case of the nitrogen. A sheet of the substrate (TPU according to section 1.1) was placed 3 mm below the installation. The treatment was carried with a nitrogen or argon flow of 250 slm. The precursor was injected as an aerosol in the plasma afterglow using two atomizers with a flow from the atomizer of 1-2 slm.

4. Method C (PlasmaZone® Technology Developed by VITO (Mol, Belgium))

The plasma treatment was carried out in a direct plasma configuration in a parallel plate DBD (dielectric barrier discharge) plasma installation at atmospheric pressure using a discharge frequency of 1.5 kHz. The dimensions of the two high voltage electrodes were 340×80 mm and the interelectrode distance (gap) of the two electrodes was 3 mm. The upper electrode was mounted on an X-moving table which was moved at a linear speed of 2 m/min. A sheet of the substrate material (TPU according to section 1.1) was placed on the lower grounded electrode. The substrate was submitted to an argon plasma (carrier gas) at a flow of 10 slm (standard 1/min) and at an input power of 70-100 W. The precursor is injected as an aerosol in the plasma zone under an argon flow of 0.8-2 slm. The number of passes was 20.

5. Method D (PlasmaZone® Technology Developed by VITO (Mol, Belgium))

The plasma treatment was carried out in a direct plasma configuration in a parallel plate DBD (dielectric barrier discharge) plasma installation at atmospheric pressure using a discharge frequency of 1.5 kHz. The dimensions of the two high voltage electrodes were 340×80 mm and the interelectrode distance (gap) of the two electrodes was 3 mm. The upper electrode was mounted on an X-moving table which was moved at a linear speed of 2 m/min. A sheet of the substrate material (TPU according to section 1.1) was placed on the lower grounded electrode. The substrate was submitted to an argon plasma (carrier gas) at a flow of 20 slm (standard 1/min) and at an input power of 100 W. The precursor is injected as an aerosol in the plasma zone under an argon flow of 0.8-1.5 slm. The number of passes were between 20-30.

6. Contact Angle Measurements

The contact angle to water (sessile drop method) was measured by applying 10 drops of water of a cut strip of the respective TPU foil. The water droplet volume was 2 microliters, and as water quality nanopure water (18.2 megaohm ionic purity) was used. The contact angle was in each case measured for an untreated (Reference) and for a coated TPU foil.

6. Sample Preparation and Measurements

6.1 Examples 1-11

According to method A, the following examples were run using TPU 1 foils as substrate. Contact angles against water of the treated foils were measured (see table 1 below).

TABLE 1

Plasma treatment conditions (method A) and contact angles against water

| Example | Precursor | Atomiser gas (slm) | Post curing | Passes (nr) | Contact angle against water |
|---|---|---|---|---|---|
| Reference | No plasma treatment | | | | 91° |
| 1 | TBAEMA | 1.5 | no | 10 | 7° |
| 2 | TBAMS | 1.5 | no | 10 | 69° |
| 3 | TBAMS | 1.5 | yes | 20 | 28° |
| 4 | TBAMS | 1.5 | no | 20 | 60° |
| 5 | TBAMS | 1.5 | no | 24 | 32° |
| 6 | TBAEMA | 1.5 | no | 20 | 7° |
| 7 | 8 wt % PTBAMS in MeOH | 2 | no | 20 | 43° |
| 8 | 8 wt % PTBAMS in MeOH | 2 | yes | 20 | 31° |
| 9 | 4 wt % PTBAMS in MeOH | 2 | yes | 20 | 28° |
| 10 | 4 wt % PTBAMS in TBAMS | 2 | yes | 20 | 30° |
| 11 | Allylamine | 1 | no | 20 | 6° |

It was clearly apparent that the CEP treatment of the TPU substrate reduced the contact angle against water at least by 22°, i.e. all plasma treated TPU substrates were clearly made more hydrophilic by the plasma deposited coating and had a contact angle <90°, preferably <70°.

6.2 Example 12-19

According to method B, the following examples were run using TPU 1 foils as substrate. Contact angles against water of the treated foils were measured (see table 2 below).

TABLE 2

Plasma treatment conditions (method B) and contact angles against water

| Example | Precursor | Atomiser gas flow (slm) | Passes (nr) | Contact angle against water |
|---|---|---|---|---|
| Reference | No plasma treatment | | | 91° |
| 12 | TBAEMA | 1.5 | 10 | 10° |
| 13 | TBAMS | 2 × 1.5 | 10 | 68° |
| 14 | TBAMS | 2 × 1.5 | 40 | 68° |
| 15 | TBAMS | 2 × 1.5 | 20 | 68° |
| 16 | TBAEMA | 2 × 1.5 | 20 | 13° |
| 17 | TBAEMA | 2 × 1.5 | 20 | 19° |
| 18 | 4 wt % PTBAMS in TBAMS | 2 × 2 | 20 | 69° |
| 19 | Allylamine | 2 × 1 | 40 | 5° |

It was clearly apparent that the CEP treatment of the TPU substrate reduced the contact angle against water at least by 22°, i.e. all plasma treated TPU substrates were clearly made more hydrophilic by the plasma deposited coating and had a contact angle <90°, preferably <70°.

6.3 Example 20-46

According to method C, the following examples were run using silicone plates (MVQ), 40 Shore, A, thickness 2 mm (supplier Kubo Tech, CH) as substrate. Contact angles against water of the treated foils were measured (see table 3 below).

TABLE 3

Plasma treatment conditions (method C) and contact angles against water

| Examples | Precursor | Atomiser gas (slm) | Power (W) | Contact angle against water |
|---|---|---|---|---|
| Reference | No plasma treatment | | | 113° |
| 20 | TBAMS | 1.5 | 100 | 15° |
| 21 | TBAMS | 2 | 100 | 52° |
| 22 | TBAMS | 1.5 | 70 | 83° |
| 23 | TBAMS | 1.5 | 100 | |
| 24 | TBAMS | 1.5 | 100 | |
| 25 | TBAEMA | 1.5 | 100 | 13° |
| 26 | TBAEMA | 1.5 | 70 | 18° |
| 27 | TBAEMA | 1.5 | 100 | |
| 28 | TBAEMA | 1.5 | 70 | |
| 29 | BAC in methanol (50 wt %) | 1.3 | 100 | 25° |
| 30 | BAC in methanol (50 wt %) | 1.3 | 70 | 19° |
| 31 | BAC in methanol (50 wt %) | 1.3 | 100 | |
| 32 | BAC in methanol (50 wt %) | 0.9 | 100 | 25° |
| 33 | BAC in methanol (50 wt %) | 0.9 | 100 | 23° |
| 34 | BAC in methanol (50 wt %) | 0.9 | 100 | |
| 35 | HDPC in methanol (50 wt %) | 1.2 | 100 | 25° |
| 36 | HDPC in methanol (50 wt %) | 1.2 | 70 | 19° |
| 37 | HDPC in methanol (50 wt %) | 0.8 | 100 | 25° |
| 38 | HDPC in methanol (50 wt %) | 0.6 | 100 | 23° |
| 39 | HDPC in methanol (50 wt %) | 1.2 | 100 | |
| 40 | HDPC in methanol (50 wt %) | 0.8 | 100 | |
| 41 | CTAB in methanol (20 wt %) | 0.8 | 100 | 25° |
| 42 | CTAB in methanol (20 wt %) | 0.6 | 100 | |
| 43 | CTAB in methanol (20 wt %) | 1 | 100 | 35° |
| 44 | CTAB in methanol (20 wt %) | 1 | 100 | |
| 45 | CTAB in methanol (20 wt %) | 1 | 70 | 25° |
| 46 | CTAB in methanol (20 wt %) | 1 | 70 | |

It was clearly apparent that the CEP treatment of the TPU substrate reduced the contact angle against water at least by 30°, i.e. all plasma treated TPU substrates were clearly made more hydrophilic by the plasma deposited coating and had a contact angle <90°, preferably <85°.

6.4 Examples 47-53

According to method D, the following examples were run using TPU 2 plates as substrate. Contact angles against water of the treated TPU plates were measured (see table 4 below.

TABLE 4

Plasma treatment conditions (method D) and contact angles against water

| Example | Precursor | Atomiser gas flow (slm) | Passes (nr) | Contact angle against water |
|---|---|---|---|---|
| Reference | No plasma treatment | | | 72° |
| 47 | TBAMS | 1.5 | 30 | 22° |
| 48 | TBAEMA | 1.5 | 30 | <5° |
| 49 | BAC (50% in MeOH) | 1.5 | 30 | <5° |
| 50 | HDPC (50% in MeOH) | 0.8 | 20 | 30° |
| 51 | HDPC (50% in MeOH) | 1.2 | 20 | Not measured |
| 52 | CTAB (20% in MeOH) | 0.8 | 30 | 8° |
| 53 | CTAB (20% in MeOH) | 1 | 20 | Not measured |

It was clearly apparent that the CEP treatment of the TPU plates reduced the contact angle against water at least by 42°, i.e. all plasma treated TPU plates were clearly made more hydrophilic by the plasma deposited coating and had a contact angle <30.

7. Antibacterial Activity

In accordance with ISO 22196:2011, bacteria were inoculated on the plasma treated surface and then covered with a regular film (HDPE or other), and incubated at 37° C. for 24 hours (table 5) and for 1 hr (table 6, 7 and 8). Afterwards, the recovery rate of the bacteria on the test surface was determined by removing the bacterial cells from the surface under addition of a validated neutralizer (e.g. SCDLP broth). The neutralizer solution was then shortly shaken to ensure complete neutralization. Aliquots of the solution containing removed bacteria were plated on suitable culture media and the number of viable bacteria was counted after appropriate incubation time (24-48 hrs).

The value of antibacterial activity of each sample was calculated according to the following formula:

$$R = \mathrm{Log}(B/C).$$

R: Value of antibacterial activity expressed as log-reduction compared to a non-plasma treated reference sample;

B: Average of the number of microorganisms on the samples without antibacterial treatment after incubation for 1 or 24 hours;

C: Average number of microorganisms on the antibacterial surface after incubation for 1 or 24 hours.

The resulting values of antibacterial activity are shown in Table 5, 6, 7 and Table 8 below.

TABLE 5 values of antibacterial activity of the CEP treated TPU 1 foil after 24 hours incubation time

| Example | Escherichia coli DSM 682 Log reduction R (Antibacterial activity) | Staphylococcus aureus ATCC 6538 Log reduction R (Antibacterial activity) | Precursor |
|---|---|---|---|
| 4 | >5.2 | >4.7 | TBAMS |
| 6 | >5.2 | >4.7 | TBAEMA |
| 8 | >5.2 | >4.7 | 8 wt % PTBAMS in MeOH |
| 10 | >5.2 | >4.7 | 4 wt % PTBAMS in TBAMS |
| 11 | >5.2 | >4.7 | Allylamine |
| 15 | >5.2 | >4.7 | TBAMS |
| 16 | >5.2 | >4.7 | TBAEMA |
| 18 | >5.2 | >4.7 | 4 wt % PTBAMS in TBAMS |
| 19 | >5.2 | >4.7 | Allylamine |

It was clearly apparent that the CEP treatment, i.e. chemically enhanced plasma treatment of the TPU 1 foil substrate surface, generated a strongly antibacterial activity of the TPU foil surface with log reduction values of at least 4.7 for *S. aureus* and at least 5.2 for *Escherichia coli*.

TABLE 6

Values of antibacterial activity of the CEP treated TPU 2 plates after 1 hour incubation time

| Example | Escherichia coli DSM 682 Log reduction R (Antibacterial activity) | Staphylococcus aureus ATCC 6538 Log reduction R (Antibacterial activity) | Precursor |
|---|---|---|---|
| 47 | 2.5 | 3.2 | TBAMS |
| 48 | 1.2 | 2.9 | TBAEMA |
| 49 | 3.1 | 3.2 | BAC (50% in MeOH) |
| 50 | 2.3 | 3.2 | HDPC (50% in MeOH) |
| 51 | 3.1 | 3.2 | HDPC (50% in MeOH) |
| 52 | 2.3 | 2.8 | CTAB (20% in MeOH) |
| 53 | 2.4 | 2.9 | CTAB (20% in MeOH) |

It was clearly apparent, that the CEP treatment, i.e. chemically enhanced plasma treatment of the TPU 2 plate substrate surface, generated an antibacterial TPU plate surface having a fast antibacterial activity. Already after 1 hour incubation (contact) time, log reduction values of up to 3.1 for *S. aureus* and at least 2.9 for *Escherichia coli* were observed.

8. Cleaning Experiments 8.1. Cleaning Experiments with Water

3×3 cm CEP treated TPU 2 plates were submerged in deionized water for 5 min. The CEP treated surface was then rinsed four times with 5 ml deionized water using a pipette. The values of antibacterial activity after washing experiments of the TPU 2 plates are summarized in Table 7.

TABLE 7

Values of antibacterial activity of the water rinsed CEP treated TPU 2 plates after 1 hr incubation time.

| Example | Escherichia coli DSM 682 [log cfu*/cm$^2$] | Staphylococcus aureus ATCC 6538 [log cfu*/cm$^2$] | Precursor |
|---|---|---|---|
| Reference | 4.4 | 4.4 | No plasma treatment |
|  | Log reduction R (Antibacterial activity) | Log reduction R (Antibacterial activity) |  |
| 54 | 3.4 | 3.4 | BAC (50% in MeOH) |
| 55 | 3.4 | 3.4 | HDPC (50% in MeOH) |

*Number of colony forming units (CFU) per cm$^2$

It was clearly apparent, that the fast and high antibacterial activity remains after rinsing the TPU plates with water.

8.2. Cleaning with Hypochlorite

3×3 cm CEP treated TPU 2 plates were submerged for 30 seconds in a 3% sodium hypochlorite solution. The plates were then submerged in water for 5 min and then rinsed four times with 5 ml deionized water using a pipette. The values of antibacterial activity after hypochlorite cleaning experiments of the TPU 2 plates are summarized in Table 8.

TABLE 8

Values of antibacterial activity hypochlorite cleaned CEP treated TPU 2 plates after 1 hr incubation time.

| Example | *Escherichia coli* DSM 682 [log cfu*/cm$^2$] | *Staphylococcus aureus* ATCC 6538 [log cfu*/cm$^2$] | Precursor |
|---|---|---|---|
| Reference | 4.3 | 4.5 | No plasma treatment |
| | Log reduction R (Antibacterial activity) | Log reduction R (Antibacterial activity) | |
| 56 | >3.6 | >3.7 | BAC (50% in MeOH) |
| 57 | nd | >3.9 | HDPC (50% in MeOH) |

*Number of colony forming units (CFU) per cm$^2$

It was clearly apparent that the fast and high antibacterial activity remains also after cleaning the TPU plates with a hypochlorite solution.

The invention claimed is:

1. A method for preparation of a polymer material having improved antibacterial properties and/or antiviral properties comprising:
    a) providing a polymer substrate having a surface;
    b) generating a plasma by passing a carrier gas through an excitation zone and by applying alternating current to an electrode positioned in the excitation zone to produce a discharge thereby generating an atmospheric plasma;
    c) generating a precursor material aerosol in a separate zone by using an atomiser gas or providing a gaseous precursor material, wherein the precursor material is a compound capable of forming radicals when in contact with an atmospheric plasma and which comprises at least one amine group;
    d) treating at least a part of the polymer substrate surface provided according to (a) with the atmospheric plasma generated according to (b) and the precursor material aerosol generated according to (c) or the gaseous precursor material provided according to (c) thereby depositing a reaction product of the precursor material at least on a part of the polymer substrate surface.

2. The method according to claim 1, wherein (d) comprises:
    d.1) treating the polymer substrate surface provided according to (a) with the atmospheric plasma generated according to (b);
    d.2a) introducing the precursor material aerosol generated according to (c) or the gaseous precursor material provided according to (c) into the atmospheric plasma used in (d.1), thereby forming an atmospheric plasma comprising the precursor material; or
    d.2b) treating the polymer substrate surface directly after step (d.1) in a plasma afterglow with the precursor material aerosol generated according to (c) or with the gaseous precursor material provided according to (c).

3. The method according to claim 1, wherein all steps (a) to (d) take place at near atmospheric pressure, in the range of from 0.5 to 1.5 bar.

4. The method according to claim 1, wherein the precursor material is a com-pound capable of forming radicals when in contact with an atmospheric plasma and which contains at least one amine group selected from the group of primary, secondary, tertiary amines and quarternary ammonium salts.

5. The method according to claim 1, wherein the precursor material is a compound of general formula (I)

R1 and R2 are independently selected from the group consisting of hydrogen atom, halo-gen atom, CN, CF3, straight or branched alkyl of from 1 to 20 carbon atoms, a (CH2)x-(CF2)y-CF3 group with x being zero or an integer in the range from 1 to 6 and y being an integer in the range from 1 to 20; or a alpha, beta-unsaturated straight or branched alkenyl or alkynyl of 2 to 10 carbon atoms, C5-C6 cycloalkyl, heterocycloalkyl, C(=Y)XR5, where Y may be S or O, and X is O or a bond, R5 is a straight or branched C1-C20 alkyl, a straight or branched C1-C20 alkoxy, a (CH2)x-(CF2)y-CF3 group with x being an integer in the range from 0 to 6 and y being an integer in the range from 1 to 20;

R3 is selected from the group consisting of hydrogen atom, halogen atom, C1-C6, alkyl and COOR6, where R6 is a C1-C6 alkyl group;

or

R1 and R3 may be joined to form a group of the formula (CH2)m, optionally substituted with one or more C1-C4 alkyl group(s), wherein m is an integer in the range of from 2 to 6; and R4 is a primary or secondary amine group of the general formula (II)

wherein
z is selected from the group consisting of —(CH2)p-, wherein p is an integer in the range of from 1 to 10; —(C(=O)—O—(CH2)q-, wherein q is an integer in the range of from 1 to 10; and —(C6H4)-(CH2)r, wherein r is an integer in the range of from 1 to 10;

R4a is a hydrogen atom, an aryl group or a branched or unbranched C1 to C10 alkyl group;

R4b is a hydrogen or is selected from the group consisting of a branched or unbranched C1 to C18-alkyl group; a C1 to C6-alkyl-phenyl-R7 group, wherein R7 is a saturated or unsaturated, branched or unbranched C1 to C6-alkyl group.

6. The method according to claim 5, wherein the compound of general formula (I) is selected from the group consisting of allyl amine, t-butylaminoethyl methacrylate (TBAEMA), t-butylaminomethyl methacrylate, t-butylaminopropyl methacrylate, t-butylaminoethyl acry-late, t-butylaminomethyl acrylate, t-butylaminopropyl acrylate, t-butylaminoethyl acryla-mide, t-butylaminomethyl acrylamide, t-butylaminopropyl acrylamide, t-butylaminoethyl methacrylamide, t-butylaminomethyl methacrylamid, t-butylaminopropyl methacrylamide, tert-butyl aminomethyl styrene (TBAMS) and poly TBAMS; or from the group consisting of tridecafluorooctyl acrylate (TFOA), methacrylic ester of methylpolyethyleneglycol (MPEG 350 MA) and 2-hydroxy-ethyl-methacrylate (HEMA).

7. The method according to claim 1, wherein the precursor material is a solution of the compound of general formula (III) in a solvent

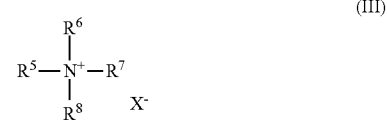

wherein R5, R6, R7 and R8 are independently selected from a group consisting of straight or branched alkyl of from 1 to 20 carbon atoms;

unsubstituted or substituted phenyl; benzyl; or wherein R5 and R6 are joined together with N+ to form a six membered ring and R7, R8 are straight or branched alkyl of from 1 to 20 carbon atoms or a bond;

wherein X– is selected from the group consisting of a halide, sulfonate, sulfate, acetate and carboxylate; and wherein the solvent is an alcohol, another polar solvent or water;

wherein the alcohol or other polar solvent has a logKOW in the range from −3 to +1.

8. The method according to claim 1, wherein the polymer substrate is a homo-polymer or copolymer selected from the group consisting of a thermoset, a thermoplastic, an elastomer and a thermoplastic elastomer.

* * * * *